US009306083B2

(12) United States Patent
Hashimoto

(10) Patent No.: US 9,306,083 B2
(45) Date of Patent: Apr. 5, 2016

(54) METHOD OF PRODUCING POLYESTER FILM, POLYESTER FILM, AND BACK SHEET FOR SOLAR CELL

(71) Applicant: FUJIFILM Corporation, Tokyo (JP)

(72) Inventor: Kiyokazu Hashimoto, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 235 days.

(21) Appl. No.: 13/967,116

(22) Filed: Aug. 14, 2013

(65) Prior Publication Data

US 2013/0323502 A1 Dec. 5, 2013

Related U.S. Application Data

(63) Continuation of application No. PCT/JP2012/055281, filed on Mar. 1, 2012.

(30) Foreign Application Priority Data

Mar. 9, 2011 (JP) .................. 2011-051779

(51) Int. Cl.

| | |
|---|---|
| *C09D 123/02* | (2006.01) |
| *C09D 133/00* | (2006.01) |
| *C09D 167/00* | (2006.01) |
| *C09D 175/04* | (2006.01) |
| *C08K 5/1515* | (2006.01) |
| *C08K 5/16* | (2006.01) |
| *C08K 5/29* | (2006.01) |
| *B32B 27/30* | (2006.01) |
| *B32B 27/32* | (2006.01) |
| *B32B 27/36* | (2006.01) |
| *B32B 27/40* | (2006.01) |
| *C08G 63/91* | (2006.01) |
| *H01L 31/049* | (2014.01) |
| *B29C 47/00* | (2006.01) |
| *B29C 55/02* | (2006.01) |
| *H01L 31/0216* | (2014.01) |
| *C08J 5/18* | (2006.01) |
| *C08J 7/04* | (2006.01) |
| *B29C 55/14* | (2006.01) |
| *H01L 31/048* | (2014.01) |
| *C09D 137/00* | (2006.01) |
| *B32B 27/08* | (2006.01) |
| *C08K 3/08* | (2006.01) |
| *C08K 5/00* | (2006.01) |
| *C08G 63/12* | (2006.01) |
| *C08G 63/16* | (2006.01) |
| *C08G 63/20* | (2006.01) |

(Continued)

(52) U.S. Cl.
CPC ........ *H01L 31/02167* (2013.01); *B29C 55/026* (2013.01); *B29C 55/14* (2013.01); *C08J 5/18* (2013.01); *C08J 7/047* (2013.01); *H01L 31/049* (2014.12); *B29C 47/0004* (2013.01); *B29C 47/0021* (2013.01); *B29C 47/0057* (2013.01); *B29C 47/0064* (2013.01); *B29K 2067/00* (2013.01); *B32B 27/08* (2013.01); *B32B 27/308* (2013.01); *B32B 27/32* (2013.01); *B32B 27/36* (2013.01); *B32B 27/40* (2013.01); *B32B 2250/26* (2013.01); *B32B 2255/10* (2013.01); *B32B 2255/26* (2013.01); *C08G 63/12* (2013.01); *C08G 63/16* (2013.01); *C08G 63/183* (2013.01); *C08G 63/20* (2013.01); *C08G 63/80* (2013.01); *C08G 63/91* (2013.01); *C08G 63/914* (2013.01); *C08G 63/916* (2013.01); *C08J 2367/02* (2013.01); *C08K 5/005* (2013.01); *C08K 5/0008* (2013.01); *C08K 5/1515* (2013.01); *C08K 5/16* (2013.01); *C08K 5/29* (2013.01); *C08K 2003/0881* (2013.01); *C09D 123/02* (2013.01); *C09D 133/00* (2013.01); *C09D 137/00* (2013.01); *C09D 175/04* (2013.01); *H01L 31/048* (2013.01); *Y02E 10/52* (2013.01); *Y10T 428/265* (2015.01); *Y10T 428/269* (2015.01); *Y10T 428/31511* (2015.04); *Y10T 428/31565* (2015.04); *Y10T 428/31786* (2015.04); *Y10T 428/31794* (2015.04); *Y10T 428/31797* (2015.04); *Y10T 428/31935* (2015.04)

(58) Field of Classification Search
None
See application file for complete search history.

(56) References Cited

U.S. PATENT DOCUMENTS 3,962,189 A * 6/1976 Russin et al. ............. 528/277
5,718,860 A * 2/1998 Lee et al. .................. 264/210.5

(Continued)

FOREIGN PATENT DOCUMENTS

JP 2004-123917 * 4/2004
JP 2004-123917 A 4/2004

(Continued)

OTHER PUBLICATIONS

Third Party Submission presented to JPO on Apr. 28, 2014, in connection with corresponding Japanese Patent Application No. 2012-045828.

(Continued)

*Primary Examiner* — Vivian Chen
(74) *Attorney, Agent, or Firm* — Jean C. Edwards, Esq.; Edwards Neils PLLC

(57) ABSTRACT

A method of manufacturing a polyester film, including: preparing a polyester film substrate having an amount of a terminal carboxylic acid group (AV) of from 3 eq/ton to 20 eq/ton, by using a polyester resin having a temperature distribution of a pre-melting peak (Tm') of from 1° C. to 10° C.; providing a coating layer on at least one surface of the polyester film substrate; and stretching the polyester film substrate provided with the coating layer at least once.

15 Claims, No Drawings

(51) Int. Cl.
  *C08G 63/183*  (2006.01)
  *C08G 63/80*  (2006.01)
  *B29K 67/00*  (2006.01)

(56) References Cited

U.S. PATENT DOCUMENTS

| | | | |
|---|---|---|---|
| 5,804,626 A * | 9/1998 | Rogers et al. | 524/195 |
| 5,910,363 A * | 6/1999 | Rogers et al. | 428/365 |
| 6,020,056 A * | 2/2000 | Walker et al. | 428/323 |
| 6,346,070 B1 * | 2/2002 | Ohmatsuzawa et al. | 528/279 |
| 6,391,441 B1 * | 5/2002 | Yano et al. | 428/343 |
| 6,500,915 B1 * | 12/2002 | Fujimori et al. | 528/279 |
| 6,610,378 B1 * | 8/2003 | Kimura et al. | 428/35.8 |
| 6,716,521 B1 * | 4/2004 | Morimoto et al. | 428/323 |
| 6,787,630 B1 * | 9/2004 | Dominguez De Walter et al. | 528/279 |
| 8,609,255 B2 * | 12/2013 | Aoyama et al. | 428/480 |
| 2002/0045068 A1 * | 4/2002 | Tojo et al. | 428/694 SL |
| 2002/0065346 A1 * | 5/2002 | Murschall et al. | 524/323 |
| 2004/0076844 A1 * | 4/2004 | Tojo et al. | 428/480 |
| 2004/0214984 A1 * | 10/2004 | Keep et al. | 528/359 |
| 2004/0265539 A1 * | 12/2004 | Hashimoto et al. | 428/141 |
| 2004/0265608 A1 * | 12/2004 | Pecorini et al. | 428/480 |
| 2005/0019555 A1 * | 1/2005 | Yano et al. | 428/328 |
| 2006/0057408 A1 * | 3/2006 | Kliesch et al. | 428/480 |
| 2006/0057409 A1 * | 3/2006 | Kliesch et al. | 428/480 |
| 2006/0275558 A1 * | 12/2006 | Pecorini et al. | 428/1.6 |
| 2007/0184262 A1 * | 8/2007 | Yano et al. | 428/323 |
| 2007/0237972 A1 * | 10/2007 | Kliesch et al. | 428/480 |
| 2007/0238816 A1 * | 10/2007 | Kliesch et al. | 524/114 |
| 2010/0000603 A1 * | 1/2010 | Tsuzuki et al. | 136/259 |
| 2010/0028600 A1 * | 2/2010 | Kojima et al. | 428/141 |
| 2010/0120946 A1 * | 5/2010 | Kliesch et al. | 523/400 |
| 2010/0167092 A1 * | 7/2010 | Kobayashi et al. | 428/832 |
| 2010/0256261 A1 * | 10/2010 | Kliesch et al. | 523/427 |
| 2010/0288353 A1 * | 11/2010 | Kliesch et al. | 136/256 |

FOREIGN PATENT DOCUMENTS

| | | | |
|---|---|---|---|
| JP | 2006-175764 A | | 7/2006 |
| JP | 2006-335853 A | | 12/2006 |
| JP | 2009-269301 A | | 11/2009 |
| JP | 2010-116560 A | | 5/2010 |
| JP | 2010-212272 | * | 9/2010 |
| JP | 2010-212272 A | | 9/2010 |
| JP | 2010-248492 | * | 11/2010 |
| JP | 2010-248492 A | | 11/2010 |
| JP | 2011-021180 | * | 2/2011 |
| JP | 2011-21180 | | 2/2011 |
| JP | 2011-208008 A | | 10/2011 |
| WO | 2010/110119 A1 | | 9/2010 |

OTHER PUBLICATIONS

International Search Report and Written Opinion issued in PCT/JP2012/055281 on Apr. 17, 2012.

* cited by examiner

US 9,306,083 B2

METHOD OF PRODUCING POLYESTER FILM, POLYESTER FILM, AND BACK SHEET FOR SOLAR CELL

CROSS-REFERENCE TO RELATED APPLICATIONS

This application is a continuation application of, and claims priority to, International Application No. PCT/JP2012/055281, filed Mar. 1, 2012, which was published under PCT Article 21(2) in Japanese, the disclosure of which is incorporated herein by reference in its entirety. Further, the PCT application and this application claim priority from Japanese Patent Application No. 2011-051779, filed Mar. 9, 2011, the disclosure of which are incorporated herein by reference in their entirety.

BACKGROUND OF THE INVENTION

1. Technical Field

The present invention relates to a method of manufacturing a polyester film, a polyester film, and a back sheet for a solar cell.

2. Background Art

Polyester is used in various applications such as electrical insulation application and optical application. Solar cell application such as a back sheet for a solar cell is particularly attracting attention recently as electrical insulation application thereof.

A solar cell has a power generating element which is encapsulated with an encapsulant such as EVA (ethylene-vinyl acetate copolymer) and is bonded to a glass substrate to be used, and a back sheet (back surface protecting member) is used therein in order to protect a back surface (an opposite surface from a sunlight incident surface) from the wind and rain.

Recently, a polyester film is become to be used as a back sheet for a solar cell like this. An easy adhesive layer for adhesing a back sheet with EVA is usually provided with a polyester film to be used for a back sheet (for example, refer to Japanese Patent Application Laid-Open (JP-A) Nos. 2006-335853, 2006-175764, and 2009-269301).

SUMMARY OF INVENTION

Technical Problem

However, when a solar cell is left to stand in an environment being exposed to wind and rain in the outdoors and the like for a long period of time, the adhesion of a back sheet deteriorates according to the lapse of long time and the back sheet is likely to separate. In addition, despite that high adhesion (wet adhesion) is requested to a solar cell even in a state where a back sheet contains moisture since a solar cell is normally used outdoors, the wet adhesion particularly deteriorates after the lapse of long time.

Therefore, a polyester film such as a back sheet for a solar cell, which is used outdoors, is specifically requested to exhibit satisfactory adhesion properties even after an acceleration test which simulates a case in which a long period of time elapsed; and have high adhesion properties particularly even in the moisture state in which an adhesion strength is likely to deteriorate.

An object of the present invention is to provide a polyester film having high adhesion between a polyester film substrate and a coating layer and a method of manufacturing the same; and a back sheet for a solar cell having high adhesion between a polyester film substrate and a coating layer.

SUMMARY

The following invention are provided in order to achieve the above-described object.

<1> A method of manufacturing a polyester film, comprising: preparing a polyester film substrate having an amount of a terminal carboxylic acid group (AV) of from 3 eq/ton to 20 eq/ton, by using a polyester resin having a temperature distribution of a pre-melting peak (Tm') of from 1° C. to 10° C.; providing a coating layer on at least one surface of the polyester film substrate; and stretching the polyester film substrate provided with the coating layer at least once.

<2> The method of manufacturing a polyester film according to <1>, wherein the preparing of a polyester film substrate comprises: obtaining the polyester resin by subjecting a polyester raw resin to a solid phase polymerization, a concentration of ethylene glycol gas at a time of the start of the solid phase polymerization being higher than a concentration of ethylene glycol gas at a time of the completion of the solid phase polymerization by from 200 ppm to 1000 ppm; and melt-extruding the polyester resin.

<3> The method of manufacturing a polyester film according to <2>, further comprising setting a concentration of water vapor at the time of the start of the solid phase polymerization to be higher than a concentration of water vapor at the time of the completion of the solid phase polymerization by 100 ppm to 500 ppm.

<4> The method of manufacturing a polyester film according to <2> or <3>, further comprising drying the polyester raw resin at 130° C. to 180° C. in a dry bath having a temperature distribution of from 1° C. to 20° C. before the solid phase polymerization.

<5> The method of manufacturing a polyester film according to any one of <1> to <4>, wherein the preparing of a polyester film comprises melt-extruding the polyester resin using a biaxial extruder provided with a screw having a diameter of 140 mm or larger.

<6> The method of manufacturing a polyester film according to any one of <1> to <5>, wherein the stretching is performed in the presence of water vapor having a concentration distribution of from 5% to 30%.

<7> The method of manufacturing a polyester film according to any one of <1> to <6>, wherein an average temperature of the pre-melting peak (Tm') is from 230° C. to 263° C.

<8> A polyester film, comprising: a polyester film substrate; and a coating layer that is provided on at least one surface of the polyester film substrate, wherein a crystallinity distribution of a surface of the polyester film substrate on the side on which the coating film is provided is from 5% to 50%.

<9> The polyester film according to <7>, wherein the coating layer comprises an acrylic resin, an urethane resin, a polyester resin, or a polyolefin resin.

<10> The polyester film according to <8> or <9>, wherein the thickness of the coating layer is from 0.05 μm to 1.5 μm <11> The polyester film according to any one of <8> to <10>, wherein a content of a component in which a total number of a carboxylic acid group and a hydroxyl group is 3 or more in the polyester film substrate is from 0.005 mol % to 2.5 mol %.

<12> The polyester film according to any one of <8> to <11>, wherein the polyester film substrate comprises at least one terminal blocking agent selected from the group consisting of an isocyanate compound, a carbodiimide compound, and an epoxy compound, at a content of from 0.1% by mass to 5% by mass.

<13> The polyester film according to any one of <8> to <12>, wherein the polyester film substrate comprises a Ti element at a content of from 2 ppm to 50 ppm.
<14> The polyester film according to any one of <8> to <13>, wherein an intrinsic viscosity (IV) of the polyester film substrate is from 0.7 to 0.9.
<15> The polyester film according to any one of <8> to <14>, which is manufactured by the method according to any one of <1> to <7>.
<16> A back sheet for a solar cell, comprising the polyester film according to any one of <8> to <15>.

Effects of Invention

According to the present invention, a polyester film having high adhesion between a polyester film substrate and a coating layer, a method of manufacturing the same, and a back sheet for a solar cell having high adhesion between a polyester film substrate and a coating layer can be provided.

DESCRIPTION OF EMBODIMENTS

Hereinafter, a polyester film having high adhesion between a polyester film substrate and a coating layer, a method of manufacturing the same, and a back sheet for a solar cell having high adhesion between a polyester film substrate and a coating layer will be described in detail.

<Polyester Film>

A polyester film according to the present invention includes a polyester film substrate; and a coating layer that is provided on at least one surface of the polyester film substrate, in which the polyester film substrate provided with the coating layer is stretched at least once, and a crystallinity distribution of a surface of the polyester film substrate on the side on which the coating film is provided is from 5% to 50%.

In the present invention, "polyester film substrate" (, which may be hereinafter simply referred to as "film substrate",) is a polyester member that functions as a support in the polyester film having the coating layer, and is a film that is formed by melt-extruding polyester resin. It may be stretched or unstretched, and may or may not be coated on the opposite surface from a surface on which the coating layer described below is provided. In the present invention, after providing the coating layer on at least one surface of such a film substrate, a stretching operation is performed at least once.

On the other hand, "polyester film" refers to a stretched laminate obtained by stretching the polyester film substrate provided with the coating layer.

—Crystallinity Distribution—

In the polyester film substrate according to the present invention, the crystallinity distribution of a surface of the film substrate on the side on which the coating film is provided is from 5% to 50%, preferably from 7% to 30%, and more preferably from 8% to 20%.

When the crystallinity distribution of the surface of the film substrate is less than 5%, the adhesion force between the film substrate and the coating layer is insufficient. When the crystallinity distribution is larger than 50%, an elastic modulus distribution is formed in the film, and when the adhesion is evaluated in a separating test, low-elastic-modulus portions are likely to separate due to the stress concentrated thereon, and as a result, the adhesion force deteriorates.

The adhesion with the coating layer is improved by imparting the crystallinity distribution to the surface of the film substrate as described above. That is, a material of the coating layer easily permeates and infiltrates portions having a relatively low crystallinity, which increases the adhesion force.

On the other hand, portions having a relatively high crystallinity have effects of improving the mechanical strength of the film substrate and suppressing deterioration in adhesion force caused by cohesion failure in the film substrate.

Particularly, a polyester film is hydrolyzed in an acceleration test, which corresponds to a case where a long period of time elapsed. In this case, in a state where a coating layer such as an easy adhesive layer is not provided thereto, the hydrolysis is remarkably observed on a surface of the film substrate which contacts the air. In this way, the molecular weight of polyester on the film surface is reduced by the hydrolysis and thus the adhesion strength with the coating layer deteriorates. In contrast thereto, according to the invention, the adhesion with the coating layer can be improved by imparting the crystallinity distribution to the surface of the film substrate on which the coating layer is formed to form a region where there are relatively more amorphous portions and a region where there are relatively more crystalline portions.

The crystallinity distribution of the surface of the film substrate is measured using an ATR-IR method. For example, ten portions, each of which having a size of 2 cm×5 cm, are made by cutting a 30 cm×30 cm film substrate to measure crystallinity values, and then a distribution is obtained from these crystallinity values.

When the polyester film according to the present invention is used for, for example, a back sheet for a solar cell, it is particularly preferable that there is a crystallinity distribution between large measurement regions as described above. Since a solar cell having a large size of approximately 1 m² is normally used, it is necessary that the adhesion force be improved over the entire region. To that end, a crystallinity distribution having a large period is more effective for improving the adhesion force of the entire back sheet than a crystallinity distribution having a small period.

When the size of the film substrate is smaller than 30 cm×30 cm, the film substrate may be cut to take ten samples having the same size to measure a crystallinity of each sample, thereby obtaining a crystallinity distribution therefrom.

<Method of Manufacturing Polyester Film>

The polyester film according to the present invention can be manufactured by, for example, the following method.

That is, a method of manufacturing a polyester film according to the present invention includes: preparing a polyester film substrate having an amount of a terminal carboxylic acid group (AV) of from 3 eq/ton to 20 eq/ton by using a polyester resin, a temperature distribution of a pre-melting peak (Tm') of which being from 1° C. to 10° C.; providing a coating layer on at least one surface of the polyester film substrate; and tretching the polyester film substrate provided with the coating layer at least once.

(Preparation of Polyester Film Substrate)

A polyester film substrate having an amount of a terminal carboxylic acid group (AV) of from 3 eq/ton to 20 eq/ton is manufactured by using a polyester resin having a temperature distribution of a pre-melting peak (Tm') of 1° C. to 10° C.

Portions having a relatively high crystallinity and portions having a relatively low crystallinity can be formed and the above-described crystallinity distribution can be formed by setting the AV of the polyester film substrate to be from 3 eq/ton to 20 eq/ton. A terminal carboxylic acid has a high polarity and is bulky, which inhibits the crystallization of polyester. Therefore, the crystallinity can be increased by reducing the AV. By setting the AV of the polyester film substrate to be 3 eq/ton to 20 eq/ton, portions having a relatively low crystallinity can be formed in places and a crystallinity distribution can be formed to a degree that it can be detected when the crystallinity is measured.

When the AV of the polyester film substrate is larger than 20 eq/ton, the frequency of the portions having a low crystallinity is exceeded and the period of the crystallinity distribution is smaller than the above-described measurement range and appears to be uniform. Therefore, a crystallinity distribution of 5% or higher is not formed. On the other hand, when the AV of the polyester film substrate is less than 3 eq/ton, the portions having a low crystallinity are excessively reduced, the crystallinity is uniform, and thus the adhesion with the coating layer is likely to deteriorate.

An intrinsic viscosity (IV) of the polyester film substrate according to the present invention is preferably from 0.70 to 0.90, more preferably from 0.73 to 0.87, and still more preferably from 0.75 to 0.85.

In this way, an effect of promoting the formation of the crystallinity distribution is obtained by using a resin having a high IV. That is, a resin having a high IV refers to a resin having a high molecular weight. Such molecules have lower mobility and thus have smaller crystal formation rate. When a crystallinity distribution is formed by a temperature distribution after coating and drying, crystallization occurs, if time permits, even in a low temperature region and the crystallinity reaches the same degree as that of a high temperature region. At this time, when the IV of the polyester film substrate is less than 0.70, the mobility of molecules is high and the crystal formation rate is high. Therefore, at the time of crystal formation performed along with stretching, crystals are generated even in a low temperature region to the same degree as that of a high temperature region and thus it is difficult to form a crystallinity distribution. On the other hand, when the IV of the polyester film substrate is more than 0.90, the mobility of molecules becomes excessively low, and thus it is difficult to form crystals even in a high temperature region, and it is difficult to make a difference in crystal formation between a high temperature region and a low temperature region.

A polyester resin having a temperature distribution of a pre-melting peak (Tm') of 1° C. to 10° C., preferably from 1.5° C. to 8° C., and more preferably from 2° C. to 6° C., is used as a raw resin which is used for preparing the polyester film substrate having an amount of a terminal carboxylic acid group (AV) of from 3 eq/ton to 20 eq/ton.

Tm' denotes a temperature at which a part of crystals are melted and reorganized. The crystallinity distribution is likely to be formed by using the polyester resin having varied temperatures, that is, varied crystalline states. When the distribution of Tm' is more than 10° C., the crystallinity distribution is likely to be more than 50%. When the distribution of Tm' is less than 1° C., the crystallinity distribution is likely to be less than 5%.

An average Tm' is preferably from 230° C. to 263° C., more preferably from 240° C. to 260° C., and still more preferably from 245° C. to 255° C.

A synergistic effect can be obtained by such Tm' and the AV, and an effect of further improving the adhesion force can be obtained.

In order to effectively exhibit the effect of the raw resin having the varied pre-melting peak (Tm'), it is preferable that a biaxial extruder provided with a screw having a diameter of preferably 140 mm or larger, more preferably 150 mm to 300 mm, and still more preferably 160 mm to 260 mm, be used for film manufacturing. As a result, melting of crystals of the raw resin can be suppressed, a crystalline structure can remain, and thus the crystallinity distribution is likely to be formed.

When a uniaxial extruder is used, a resin is transported by friction between a screw and the resin, which generates a high friction force. As a result, a crystalline structure is likely to be broken. On the other hand, when a biaxial extruder is used, a resin is transported on a screw and a friction force is low. Therefore, a crystalline structure is likely to remain and a crystallinity distribution is likely to be imparted due to the distribution of Tm'.

When the diameter of the screw is larger than or equal to 140 mm, a discharge amount per rotation is large. Therefore, the rotating speed can be reduced and the crystal breakage by a friction force can be reduced. When the diameter of the screw is less than 140 mm, it is difficult to reduce a friction force and there is a concern that the crystallinity distribution of the polyester film substrate may be less than 5%. On the other hand, when the diameter of the screw is larger than 300 mm, a crystalline structure excessively remains and there is a concern that the crystallinity distribution may be higher than 50%.

It is preferable that a polyester resin used as a raw resin of the polyester film substrate be polymerized in the solid phase. In particular, it is preferable that the solid phase polymerization be performed while setting a concentration of ethylene glycol (EG) gas at the time of the start of solid phase polymerization being higher than a concentration of EG gas at a time of the completion of the solid phase polymerization by 200 ppm to 1000 ppm, more preferably 250 ppm to 800 ppm, and still more preferably 300 ppm to 700 ppm. At this time, the average concentration of EG gas (the average of gas concentrations at the time of the start and the completion of solid phase polymerization) is preferably from 100 ppm to 500 ppm, more preferably from 150 ppm to 450 ppm, and still more preferably from 200 ppm to 400 ppm.

A temperature of the solid phase polymerization is preferably from 180° C. to 230° C., more preferably from 190° C. to 215° C., and still more preferably from 195° C. to 209° C.

T A time of the solid phase polymerization is preferably from 10 hours to 80 hours, more preferably from 15 hours to 60 hours, and still more preferably from 20 hours to 45 hours.

In particular, by imparting a concentration distribution of EG gas during solid phase polymerization, the AV can be efficiently reduced while suppressing an increase in IV, and values of the AV and IV in the above-described ranges can be obtained. That is, it is effective that the EG concentration is high in the initial stage of the solid phase polymerization, and the EG concentration is low in the later stage of the solid phase polymerization. Due to the solid phase polymerization, terminal groups of molecules of polyethylene terephthalate (PET) are bonded to each other (polymerized) to increase the molecular weight. As the PET molecule terminal groups, there are a terminal carboxylic acid group and a terminal hydroxyl group. A bond between PET molecules is formed by esterification reaction in which a terminal hydroxyl group and a terminal carboxylic acid group are bonded or ester exchange reaction in which terminal hydroxyl groups are bonded. In order to efficiently reduce the amount of a terminal carboxylic acid group, it is preferable that terminal carboxylic acid groups be caused to react with EG gas to obtain terminal hydroxyl groups before the bonding of PET molecules, followed by ester exchange reaction to increase the molecular weight. As a result, the amount of a terminal carboxylic acid group (AV) can be further efficiently reduced. It is preferable that such reaction between a terminal carboxylic acid group and EG be performed in the initial stage of the solid phase polymerization in which the PET molecular weight is low and the mobility (reactivity) is high, and it is effective that the EG concentration in the initial stage of the solid phase polymerization be high.

In this way, the crystallinity distribution after manufacturing can be made to be within the range of the present invention by selectively reducing the AV. That is, by reducing the AV, the amount of a bulky terminal carboxylic acid group can be reduced, PET molecules are easily arranged, and crystallization easily occurs. As a result, crystallization easily occurs anywhere in the film and the crystallinity distribution is reduced. As a result, when the AV is less than 3 eq/ton, the crystallinity distribution is less than the range (5%) of the present invention. When the AV is larger than 20 eq/ton, crystalline properties deteriorate and a difference between portions where crystallization is likely to occur and portions where crystallization is not likely to occur is easily generated. As a result, the crystallinity distribution is larger than the range (50%) of the present invention, which is not preferable.

The reason is as follows. When the concentration distribution of EG gas (the difference between the EG gas concentrations at the time of the start and the completion of the solid phase polymerization) is larger than 1000 ppm, since the EG concentration in the initial stage of the solid phase polymerization is too high, the solid phase polymerization rate is reduced (since EG is generated along with the bonding of PET molecules, the bonding of PET molecules is suppressed when the concentration of EG, which is a product thereof is too high), and thus the IV does not reach the range of the present invention. When the concentration distribution of EG gas is less than 200 ppm, the AV cannot be efficiently (selectively) reduced, which is not preferable.

A gradient of EG gas concentration during the solid phase polymerization can be achieved by introducing gasified EG into a solid phase polymerization container and increasing the concentration thereof over time.

Meanwhile, a gradient of water vapor concentration during the solid phase polymerization has a function of forming a temperature distribution of Tm'. It is preferable that the solid phase polymerization be performed while setting a concentration of water vapor at the time of the start of the solid phase polymerization to be higher than a concentration of water vapor at the time of the completion of the solid phase polymerization by 100 ppm to 500 ppm, preferably 150 ppm to 400 ppm, and more preferably 200 ppm to 350 ppm.

At this time, the average concentration of water vapor (the average of water vapor concentrations at the time of the start and the completion of solid phase polymerization) is preferably from 50 ppm to 400 ppm, more preferably from 80 ppm to 300 ppm, and still more preferably from 100 ppm to 250 ppm.

By forming a gradient of water vapor concentration, a difference in moisture content is generated in pellets during solid phase polymerization. As a result, the Tg is reduced and a distribution in Tg is formed. As the Tg is reduced, the mobility of molecules is increased and thus crystallization easily occurs. As a result, a distribution in Tm' is formed between pellets.

When the concentration distribution of water vapor (the difference between water vapor concentrations at the time of the start and the completion of solid phase polymerization) is larger than 500 ppm, the Tm' distribution becomes large. When the concentration distribution of water vapor is less than 100 ppm, the Tm' distribution becomes small.

A gradient of water vapor concentration during the solid phase polymerization can be achieved by introducing water vapor into a solid phase polymerization container and increasing the concentration thereof over time.

In addition, a temperature distribution of Tm' of the raw resin can be formed by drying the raw resin at preferably from 130° C. to 180° C., more preferably from 140° C. to 175° C., and still more preferably from 145° C. to 170° C., in a dry bath having a temperature distribution of preferably from 1° C. to 20° C., more preferably from 2° C. to 15° C., and still more preferably from 3° C. to 10° C., before the solid phase polymerization. A direction of the temperature distribution in the dry bath is not particularly limited, and may be a height direction or a width direction of the dry bath.

Along with the drying of the raw resin (for example, PET), moisture is volatilized. Moisture has a plasticizing effect on PET and improves the mobility. As a result, PET molecules aggregate and crystals are easily generated. At this time, by imparting a distribution to a temperature of the drying, a distribution is imparted to the moisture content in pellets, which imparts a distribution to the crystal formation to form the Tm' distribution.

When the temperature distribution of the dry bath is more than 20° C., the Tm' temperature distribution of the raw resin is large. When the temperature distribution of the dry bath is less than 1° C., the Tm' temperature distribution of the raw resin is small.

Regarding the temperature distribution of the dry bath, plural ports for blowing warm air may be provided to the dry bath to blow air having different temperatures; a heater may be provided in a part of the vicinity of the dry bath to increase the temperature of a part of the resin; or a heat source having a different temperature from the temperature of the dry bath may be provided to the dry bath to impart the temperature distribution.

The polyester resin preferably includes Ti element at an amount of from 2 ppm to 50 ppm, more preferably from 3 ppm to 30 ppm, and still more preferably from 4 ppm to 15 ppm. It is preferable that a Ti compound which is the Ti element in the polyester resin be present as a metal complex and act as a PET polymerization catalyst. Such a metal complex is uniformly dispersed in PET and it hardly becomes a crystal nucleus. As a result, the crystallization rate is reduced and crystal formation as described above is varied, thereby promoting the formation of the Tm' temperature distribution. On the other hand, when the crystallization rate is high, crystallization advances irrespective of the above-described conditions, and as a result, an uniform crystallinity distribution is formed, and a Tm' distribution is hardly formed.

When the concentration of a Ti catalyst in the polyester resin is lower than 2 ppm, it is difficult to form crystals and a Tm' distribution is likely to be small. On the other hand, when the concentration of a Ti catalyst is higher than 50 ppm, it is easy to form crystals and as a result, it is difficult to impart a difference in crystal properties, and a Tm' distribution is likely to deteriorate.

The polyester which is the raw resin may be synthesized from a dicarboxylic acid component and a diol component, or may be a commercially available polyester.

When polyester is synthesized, a polyester may be obtained by, for example, causing esterification reaction and/or ester exchange reaction of (A) a dicarboxylic acid component and (B) a diol component with a known method.

Examples of (A) the dicarboxylic acid component include dicarboxylic acids and ester derivatives thereof, and examples of the dicarboxylic acids include aliphatic dicarboxylic acids such as malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethylmalonic acid; alicyclic dicarboxylic acids such as adamantane dicarboxylic acid, norbornene dicarboxylic acid, isosorbide, cyclohexane dicarboxylic acid, and decalin dicarboxylic acid; and aromatic dicarboxylic acids such as terephthalic acid, isophthalic acid, fumaric acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyl ether dicarboxylic acid, 5-sodiumsulfoisophthalic acid, phenylindan dicarboxylic acid, anthracene dicarboxylic acid, phenanthrene dicarboxylic acid, 9,9'-bis(4-carboxyphenyl)fluorene acid.

Examples of (B) the diol component include diol compounds, and examples of the diol compounds include aliphatic diols such as ethylene glycol, 1,2-propanediol, 1,3-propanediol, 1,4-butandediol, 1,2-butanediol, and 1,3-butanediol; alicyclic diols such as cyclohexanedimethanol, spiroglycol, and isosorbitol; and aromatic diols such as bisphenol a, 1,3-benzenedimethanol, 1,4-benzenedimethanol, and 9,9'-bis(4-hydroxyphenyl)fluorene.

It is preferable that at least one kind of aromatic dicarboxylic acid be used as (A) the dicarboxylic acid component. It is more preferable that polyester contain an aromatic dicarboxylic acid as a major component among dicarboxylic acid components. The "major component" refers to that a ratio of the aromatic dicarboxylic acid to the dicarboxylic acid components is 80% or higher. Polyester may contain a dicarboxylic acid component other than an aromatic dicarboxylic acid. Examples of such a dicarboxylic acid component include ester derivatives of aromatic dicarboxylic acids and the like.

In addition, it is preferable that at least one kind of aliphatic diol be used as (B) the diol component. As the aliphatic diol, polyester can contain ethylene glycol, and it is preferable that polyester contain ethylene glycol as a major component. The "major component" refers to that a ratio of the ethylene glycol to diol components is 80% or higher.

The amount of the aliphatic diol (for example, ethylene glycol) used is preferably from 1.015 mol to 1.50 mol with respect to 1 mol of the aromatic dicarboxylic acid (for example, terephthalic acid) and, an ester derivative as necessary. The amount is more preferably from 1.02 mol to 1.30 mol, and still more preferably from 1.025 mol to 1.10 mol. When the amount is larger than or equal to 1.015, esterification reaction satisfactorily advances. When the amount is less than or equal to 1.50, for example, by-production of diethylene glycol by the dimerization of ethylene glycol is suppressed, and various properties such as melting point, glass transition temperature, crystalline properties, heat resistance, hydrolysis resistance, and weather resistance can be satisfactorily maintained.

A conventionally-known catalyst can be used for esterification reaction and/or ester exchange reaction. Examples of the catalyst include alkali metal compounds, alkaline earth metal compounds, zinc compounds, lead compounds, manganese compounds, cobalt compounds, aluminum compounds, antimony compounds, titanium compounds, and phosphorus compounds. Usually, it is preferable that an antimony compound, a germanium compound, or a titanium compound be added as a polymerization catalyst in an arbitrary state prior to the completion of the method of manufacturing polyester. In such a method, for example, in the case of a germanium compound, it is preferable that germanium compound particles be added as it is.

For example, in an esterification reaction process, the aromatic dicarboxylic acid and the aliphatic diol are polymerized in the presence of a catalyst containing a titanium compound. This esterification reaction process uses an organic chelate titanium complex having an organic acid as a ligand is used as the titanium compound which is a catalyst. The process includes at least a step of adding the organic chelate titanium complex, a magnesium compound, and a pentavalent phosphoric acid ester which does not have an aromatic ring as a substituent in this order.

First, before the addition of the magnesium compound and the phosphorus compound, the aromatic dicarboxylic acid and the aliphatic diol are mixed with the catalyst containing the organic chelate titanium complex which is the titanium compound. Since the titanium compound such as the organic chelate titanium compound has high catalytic activity in esterification reaction, esterification reaction can be satisfactorily performed. At this time, the titanium compound may be added to a mixture of the dicarboxylic acid component and the diol component, or a mixture of the dicarboxylic acid component (or the diol component) and the titanium compound may be mixed with the diol component (or the dicarboxylic acid component). Alternatively, the dicarboxylic acid component, the diol component, and the titanium compound may be simultaneously mixed with each other. A mixing method is not particularly limited, and a conventionally-known method can be used.

As polyester, polyethylene terephthalate (PET) and polyethylene-2,6-naphthalate (PEN) are more preferable, and PET is still more preferable.

It is preferable that such a polyester film substrate contain a component in which a total number of a carboxylic acid group(s) and a hydroxyl group(s) is 3 or more (hereinafter, referred to as "≥trifunctional component") or a terminal blocking agent, that is at least one of an isocyanate compound, a carbodiimide compound, or an epoxy compound. The "trifunctional component" or "terminal blocking agent" may be used alone or may be used in combination.

It is preferable that the polyester film substrate according to the present invention contain the "≥trifunctional component", that is, the component in which the total number (a+b) of a carboxylic acid group(s) (a) and a hydroxyl group(s) (b) is 3 or more. In this case, among the components in which the total number (a+b) of a carboxylic acid group(s) (a) and a hydroxyl group(s) (b) is 3 or more (≥trifunctional component: p), examples of a carboxylic acid component in which the number of carboxylic acid groups (a) is 3 or more are as follows. Examples of a trifunctional aromatic carboxylic acid component include trimesic acid, trimellitic acid, pyromellitic acid, naphthalenetricarboxylic acid, and anthracenetricarboxylic acid. Examples of a trifunctional aliphatic carboxylic acid component include methanetricarboxylic acid, ethanetricarboxylic acid, propanetricarboxylic acid, and butanetricarboxylic acid. Examples of a tetrafunctional aromatic carboxylic acid component include benzenetetracarboxylic acid, benzophenonetetracarboxylic acid, naphthalenetetracarboxylic acid, anthracenetetracarboxylic acid, and perylenetetracarboxylic acid. Examples of a tetrafunctional aliphatic carboxylic acid component include ethanetetracarboxylic acid, ethylenetetracarboxylic acid, butanetetracarboxylic acid, cyclopentanetetracarboxylic acid, cyclohexanetetracarboxylic acid, and adamantanetetracarboxylic acid. Examples of a pentafunctional or higher-functional aromatic carboxylic acid component include benzenepentacarboxylic acid, benzenehexacarboxylic acid, naphthalenepentacarboxylic acid, naphthalenehexacarboxylic acid, naphthaleneheptacarboxylic acid, naphthaleneoctacarboxylic acid, anthracenepentacarboxylic acid, anthracenehexacarboxylic acid, anthraceneheptacarboxylic acid, and anthraceneoctacarboxylic acid. Examples of a pentafunctional or higher-functional aliphatic carboxylic acid component include ethanepentacarboxylic acid, ethaneheptacarboxylic acid, butanepentacarboxylic acid, butaneheptacarboxylic acid, cyclopentanepentacarboxylic acid, cyclohexanepentacarboxylic acid, cyclohexanehexacarboxylic acid, adamantanepentacarboxylic acid, and adamantanehexacarboxylic acid. In addition, other examples of the carboxylic acid component include ester derivatives and anhydrides of the above-described examples. However, the carboxylic acid component is not limited to these examples. In addition, a compound which is obtained by adding, to a carboxy terminal of the above-described carboxylic acid component, l-lactide, d-lactide, an oxyacid such as hydroxybenzoic acid, a derivative thereof, or a plural number of such oxyacids connected in series is also preferably used. These compounds may be used alone, or plural kinds may be used in combination as necessary.

In addition, examples of the component (p) in which the number of a hydroxyl group(s) (b) is 3 or more are as follows. Examples of a trifunctional aromatic component include trihydroxybenzene, trihydroxynaphthalene, trihydroxyanthracene, trihydroxycalchone, trihydroxyflavone, and trihydroxycoumarin. Examples of a trifunctional aliphatic alcohol component (p) include glycerin, trimethylolpropane, and propanetriol. Examples of a tetrafunctional aliphatic alcohol component include a compound such as pentaerythritol. In addition, a component (p) obtained by adding a diol to a terminal hydroxyl group of the above-described compounds can be also preferably used. These compounds may be used alone, or plural kinds may be used in combination as necessary.

Examples of other components (p) include oxyacids such as hydroxyisophthalic acid, hydroxyterephthalic acid, and dihydroxyterephthalic acid, which contain both a hydroxyl group(s) and a carboxylic acid group(s) in one molecule and in which the total number (a+b) of a carboxylic acid group(s) (a) and a hydroxyl group(s) (b) is 3 or more. In addition, a compound which is obtained by adding, to a carboxy terminal of the above-described carboxylic acid component, 1-lactide, d-lactide, an oxyacid such as hydroxybenzoic acid, a derivative thereof, or a plural number of such oxyacids connected in series is also preferably used. These compounds may be used alone, or plural kinds may be used in combination as necessary.

In the polyester film substrate used in the present invention, a content of the component (≥trifunctional component: p) is preferably from 0.005 mol % to 2.5 mol % with respect to all components of the polyester film substrate. The content is more preferably from 0.020 mol % to 1 mol %, still more preferably 0.025 mol % to 1 mol %, even still more preferably 0.035 mol % to 0.5 mol %, even yet still more preferably 0.05 mol % to 0.5 mol %, and particularly preferably 0.1 mol % to 0.25 mol %.

When the ≥trifunctional component is present in the polyester film substrate, a functional group which is not used for polycondensation forms a hydrogen bond or a covalent bond with a component in the coating layer, thereby improving the adhesion. Such an effect is synergistically obtained by using the polyester film substrate having both the ≥trifunctional component and the crystallinity distribution according to the present invention. That is, a material of the coating layer which infiltrates the portions having a relatively low crystallinity forms a bond with the functional group, thereby improving the adhesion force. At this time, due to the infiltration, the number of components which react with the functional groups is further increased compared to a reaction only on a surface, and thus the adhesion force is easily increased. Therefore, when the content of the ≥trifunctional component (p) is larger than or equal to 0.005 mol %, the adhesion is more easily improved. Meanwhile, when the content of the ≥trifunctional component (p) is less than or equal to 2.5 mol %, crystals are formed in polyester and the strength does not easily deteriorate. As a result, cohesion failure does not easily occur and thus the adhesion strength can be improved.

In addition, according to the present invention, it is preferable that the polyester film substrate contain a terminal blocking agent. Preferable examples of the terminal blocking agent include an isocyanate compound, a carbodiimide compound, and an epoxy compound. These compounds may be used alone or may be used in combination. By using the terminal blocking agent in combination with the polyester film substrate having the crystallinity distribution according to the present invention, a synergistic effect is obtained. That is, when the polyester film substrate having the crystallinity distribution according to the present invention contains the terminal blocking agent, the adhesion is promoted due to a synergistic effect. That is, a coating solution permeates the portions of the polyester film substrate having a low crystallinity to infiltrate each other, thereby improving the adhesion. At this time, since a terminal of the polyester film reacts with the terminal blocking agent to be bulky, the terminal becomes to be hardly removed from a component of the coating solution (anchor effect). As a result, the interaction force is increased and the adhesion is improved.

A content of the terminal blocking agent in the polyester film substrate is preferably from 0.1% by mass to 5% by mass, more preferably from 0.3% by mass to 4% by mass, and still more preferably from 0.5% by mass to 2% by mass. When the content is larger than 0.1% by mass, the anchor effect is likely to be exhibited and the adhesion force is more easily improved. Meanwhile, when the content is less than or equal to 5% by mass, the arrangement difficulty of polyester molecules by the bulky terminal is suppressed and crystals are easily formed. As a result, portions having a high crystallinity are increased and a crystallinity distribution is easily formed, thereby improving the adhesion force.

The terminal blocking agent is an additive which reacts with a terminal carboxyl group of polyester and reduces the amount of a terminal carboxyl group, and is preferably a compound having a carbodiimide group, an epoxy group, or an oxazoline group.

Examples of a carbodiimide compound having a carbodiimide group include monofunctional carbodiimide and polyfunctional carbodiimide. Examples of the monofunctional carbodiimide include dicyclohexylcarbodiimide, diisopropylcarbodiimide, dimethylcarbodiimide, diisobutylcarbodiimide, dioctylcarbodiimide, t-butyl-isopropyl-carbodiimide, diphenylcarbodiimide, di-t-butylcarbodiimide, and di-β-naphthylcarbodiimide. Among these, dicyclohexylcarbodiimide and diisopropylcarbodiimide are preferable.

Carbodiimide having a polymerization degree of 3 to 15 is preferably used as the polyfunctional carbodiimide. Specific examples thereof include 1,5-naphthalenecarbodiimide, 4,4'-diphenylmethanecarbodiimide, 4,4-diphenyldimethylmethanecarbodiimide, 1,3-phenylenecarbodiimide, 1,4-phenylenediisocyanate, 2,4-tolylenecarbodiimide, 2,6-tolylenecarbodiimide, mixture of 2,4-tolylenecarbodiimide and 2,6-tolylenecarbodiimide, hexamethylenecarbodiimide, cyclohexane-1,4-carbodiimide, xylylenecarbodiimide, isophoronecarbodiimide, isophoronecarbodiimide, dicyclohexylmethane-4,4'-carbodiimide, methylcyclohexanecarbodiimide, tetramethylxylylenecarbodiimide, 2,6-diisopropylphenylcarbodiimide, and 1,3,5-triisopropylbenzene-2,4-carbodiimide.

It is preferable that the carbodiimide compound have high heat resistance because isocyanate gas is generated by thermal decomposition. In order to increase heat resistance, it is preferable that the molecular weight (polymerization degree) be higher; and it is more preferable that a terminal of the carbodiimide compound have a highly heat-resistant structure. In addition, once thermal decomposition occurs, further thermal decomposition easily occurs. Therefore, some means such as making the extrusion temperature of polyester be as low as possible is necessary.

The polyester film substrate according to the present invention to which such a carbodiimide compound is added is preferably one that the amount of the isocyanate gas generated therefrom at a temperature of 300° C. for 30 minutes be from 0% by mass to 0.02% by mass° C. The isocyanate gas is gas having an isocyanate group, and examples thereof include diisopropylphenyl isocyanate, 1,3,5-triisopropyl-phenyl diisocyanate, 2-amino-1,3,5-triisopropyl-phenyl-6-isocyanate, 4,4'-dicyclohexylmethane diisocyanate, isophorone diisocyanate, and cyclohexyl isocyanate. When the isocyanate gas is out of the above-described range, voids are generated in the polyester film substrate. The voids become stress concentration points in an adhesion test, and cracking and separation occur at these points in the polyester film. As a result, adhesion failure is likely to occur.

Preferable examples of the epoxy compound include a glycidyl ester compound and a glycidyl ether compound.

Specific examples of the glycidyl ester compound include glycidyl benzoate, glycidyl t-Bu-benzoate, glycidyl p-toluate, glycidyl cyclohexanecarboxylate, glycidyl pelargonate, glycidyl stearate, glycidyl laurate, glycidyl palmate, glycidyl behenate, glycidyl versatate, glycidyl oleate, glycidyl linolate, glycidyl linolenate, glycidyl behenolate, glycidyl stearolate, diglycidyl terephthalate, diglycidyl isophthalate, diglycidyl phthalate, diglycidyl naphthalenedicarboxylate, diglycidyl methylterephthalate, diglycidyl hexahydrophthalate, diglycidyl tetrahydrophthalate, diglycidyl cyclohexanedicarboxylate, diglycidyl adipate, diglycidyl succinate, diglycidyl sebacate, diglycidyl dodecanedioate, diglycidyl octadecanedicarboxylate, triglycidyl trimellitate, and tetraglycidyl pyromellitate. These compounds can be used alone or in combination of two or more kinds.

Specific examples of the glycidyl ether compound include phenyl glycidyl ether, O-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γγ-epoxypropoxy)-2-benzyloxyethane, 2,2-bis-[p-(β,γ-epoxypropoxy)phenyl]propane, and bisglycidyl polyethers obtained through reaction of a bisphenol such as 2,2-bis(4-hydroxyphenyl)propane or 2,2-bis-(4-hydroxyphenyl)methane with epichlorohydrin. These compounds may be used alone or in combination of two or more kinds.

A bisoxazoline compound is preferable as the oxazoline compound, and specific examples thereof include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline), and 2,2'-diphenylenebis(2-oxazoline). Among these, 2,2'-bis(2-oxazoline) is most preferably used from the viewpoint of reactivity with polyester. The exemplified bisoxazoline compounds may be used alone or in combination of two or more kinds as long as the object of the present invention is achieved.

The PET is preferably a compound which is polymerized using, as a catalyst component, one kind or two or more kinds selected from a germanium (Ge) compound (Ge catalyst), an ammonium (Sb) compound (Sb catalyst), an aluminum (Al) compound (Al catalyst), or a titanium compound (Ti) compound (Ti catalyst), the catalyst component being more preferably the titanium compound.

The titanium compound has high reaction activity and thus enables to reduce the temperature of polymerization. Therefore, the thermal decomposition of polyester and the generation of COOH, which may particularly occur during polymerization reaction, can be suppressed. That is, by using the titanium compound, the amount of a terminal carboxylic acid group, which causes thermal decomposition, in polyester can be reduced and the formation of foreign materials can be suppressed. The thermal decomposition of a polyester film after manufacturing the polyester film can be also reduced by reducing the amount of a terminal carboxylic acid group in polyester.

Among titanium compounds, titanium oxide which is used as a whitening agent cannot exhibit such an effect.

[Titanium Catalyst]

It is preferable that the titanium compound used as a catalyst, that is, the titanium catalyst be at least one kind of organic chelate titanium complex having an organic acid as a ligand. Examples of the organic acid include citric acid, lactic acid, trimellitic acid, and malic acid. Among these, an organic chelate complex having citric acid or citrate as a ligand is preferable.

For example, when a chelate titanium complex having citric acid as a ligand is used, generation of impurities such as fine particles is less, and polyester having better polymerization activity and color tone can be obtained as compared to those prepared using another titanium compound. Further, among cases case where a citric acid chelated titanium complex is used, when a method including adding it at esterification reaction stage is employed, polyester having better polymerization activity and color tone can be obtained as compared to those prepared using a method including adding it after esterification reaction. With regard to this point, it is presumed that the titanium catalyst has a catalytic effect in esterification reaction and reduces the acid value of an oligomer after the completion of esterification reaction by adding it in the stage of esterification, thereby subsequent polycondensation reaction being efficiently performed; and that the complex having citric acid as a ligand has higher hydrolysis resistance than titanalkoxide or the like and effectively functions as a catalyst for esterification reaction and polymerization reaction while maintaining its activity without being hydrolyzed during esterification reaction.

In addition, it is generally known that, as the amount of a terminal carboxylic acid group is larger, hydrolysis resistance further deteriorates. Therefore, the improvement of hydrolysis resistance can be expected by reducing the amount of a terminal carboxylic acid group by using the above-described addition method.

The citric acid chelated titanium complex is easily commercially available, and examples thereof include VERTEC AC-420 manufactured from Johnson Matthey Co.

The aromatic dicarboxylic acid and the aliphatic diol can be introduced by: preparing a slurry containing these; and continuously supplying the slurry in the esterification reaction process.

In general, examples of the titanium compound other than the organic chelate titanium complex include oxides, hydroxides, alkoxides, carboxylates, carbonates, oxalates, and halides. The organic chelate titanium complex may be used in combination with another titanium compound within a range not impairing the effects of the present invention.

Examples of such a titanium compound include a titanium alkoxide such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate, or tetrabenzyl titanate; a titanium oxide obtained by hydrolysis of a titanium alkoxide; a titanium-silicon composite oxide or a titanium-zirconium composite oxide obtained by hydrolysis of a mixture of a titanium alkoxide and a silicon alkoxide or a zirconium alkoxide; and titanium acetate, titanium oxalate, potassium titanium oxalate, sodium titanium oxalate, potassium titanate, sodium titanate, titanic acid-aluminum hydroxide mixture, titanium chloride, titanium chloride-aluminum chloride mixture, and titanium acetylacetonate.

When polyester is polymerized, the titanium compound (including the titanium catalyst) is used in an amount of preferably from 2 ppm to 50 ppm, more preferably from 2 ppm to 30 ppm, and still more preferably from 3 ppm to 15 ppm. In this case, a content of a titanium element included in the raw polyester is from 2 ppm to 50 ppm.

When the amount of the titanium compound (including the titanium catalyst) included in the raw polyester is less than 2 ppm, the weight average molecular weight (Mw) of polyester cannot be increased and thus thermal decomposition easily occurs. Therefore, foreign materials are likely to increase in an extruder. When the amount of the titanium compound (including the titanium catalyst) included in the raw polyester is larger than 50 ppm, the titanium compound (including the titanium catalyst) becomes a foreign material and causes a stretching distribution when the polyester film substrate is stretched, which is not preferable.

According to the present invention, it is preferable that: the aromatic dicarboxylic acid and the aliphatic diol be polymerized in the presence of a catalyst containing a titanium compound; at least one kind of the titanium compound be the organic chelate titanium complex having an organic acid as a ligand; and that the method of manufacturing polyester include the esterification process which includes at least the step of adding the organic chelate titanium complex, a magnesium compound, and a pentavalent phosphoric acid ester not having an aromatic ring as a substituent in this order and a polycondensation process of polycondensating an esterified reaction product produced in the esterification reaction process to obtain a polycondensate.

In this case, the reaction activity of the titanium catalyst is appropriately maintained at a high level and the decomposition reaction of the polycondensate can be effectively suppressed while imparting electrostatic application properties with magnesium by arranging the order of addition so that the magnesium compound is added in the presence of the organic chelate titanium complex as the titanium compound and then a specific pentavalent phosphorus compound is added thereto in the esterification process. As a result, polyester is obtained in which coloring is reduced, high electrostatic application properties are obtained, and yellowing is improved when being exposed to a high temperature.

Thereby, it is possible to obtain polyester in which coloring during polymerization and coloring during subsequent melting film formation are reduced, yellow tinge is reduced compared to polyester prepared using an antimony (Sb) catalyst of the related art, and which has equivalent color tone and transparency to those of polyester prepared using a germanium catalyst having relatively high transparency and further has excellent heat resistance. Further, polyester which has high transparency and reduced tinge of yellow can be obtained without using a color tone adjuster such as a cobalt compound or a dye.

This polyester can be used for applications having high requirements on transparency (for example, an optical film or an industrial lith film) and can realize significant cost reduction since an expensive germanium catalyst is not needed therefor. Further, since the contamination of foreign materials, which is likely to occur in polyester prepared using a Sb catalyst, is avoidable, failure or quality defects during film manufacturing can be reduced and cost reduction can be realized by the improvement of yield ratio.

When the esterification reaction is performed, the step in which the organic chelate titanium complex which is the titanium compound, the magnesium compound, and the pentavalent phosphorus compound are added in this order is provided. At this time, esterification reaction is performed in the presence of the organic chelate titanium complex, and then the magnesium compound is added before the addition of the phosphorus compound.

[Phosphorus Compound]

At least one kind of pentavalent phosphoric acid ester which does not have an aromatic ring as a substituent is used as the pentavalent phosphorus compound. Examples thereof include a phosphoric acid ester which includes a lower alkyl group having 2 or less carbon atoms as a substituent $((OR)_3-P=O$, in which R represents an alkyl group having 1 or 2 carbon atoms). Specifically, trimethyl phosphate and triethyl phosphate are particularly preferable.

The amount of the phosphorus compound added in terms of P element is preferably from 50 ppm to 90 ppm. The amount of the phosphorus compound is more preferably from 60 ppm to 80 ppm and still more preferably from 60 ppm to 75 ppm.

[Magnesium Compound]

The electrostatic application property of polyester is improved by incorporating the magnesium compound into the polyester. In this case, coloring is likely to occur. However, according to the present invention, coloring is suppressed and superior color tone and heat resistance are obtained.

Examples of the magnesium compound include magnesium salts such as magnesium oxide, magnesium hydroxide, magnesium alkoxide, magnesium acetate, and magnesium carbonate. Among these, magnesium acetate is most preferable from the viewpoint of solubility to ethylene glycol.

In order to impart high electrostatic application property, the amount of the magnesium compound added is preferably larger than or equal to 50 ppm, and more preferably from 50 ppm to 100 ppm, in terms of Mg element. From the viewpoint of imparting the electrostatic application property, the amount of the magnesium compound added is preferably from 60 ppm to 90 ppm, and more preferably from 70 ppm to 80 ppm.

In the esterification reaction process, it is particularly preferable that the titanium compound, which is a catalyst component, and the magnesium compound and the phosphorus compound, which are additives, be added and be subjected to melt polymerization such that the value Z calculated from the following Expression (i) satisfies the following relational Expression (ii). In this expression, P Content refers to the content of phosphorus which is derived from all the phosphorus compounds including the pentavalent phosphoric acid ester not having an aromatic ring; and Ti Content refers to the content of titanium which is derived from all the titanium compounds including the organic chelate titanium complex. In this way, a combination of the magnesium compound and the phosphorus compound is selected in the catalyst system containing the titanium compound and the addition timing and addition ratio are controlled. As a result, color tone having reduced tinge of yellow is obtained while maintaining the catalytic activity of the titanium compound at an appropriately high level, and heat resistance with which yellowing does not easily occur can be imparted even when being exposed to a high temperature during polymerization reaction or during subsequent film formation (during melting).

$$Z=5\times(\text{P Content (ppm)}/\text{P Atomic Weight})-2\times(\text{Mg Content (ppm)}/\text{Mg Atomic Weight})-4\times(\text{Ti Content (ppm)}/\text{Ti Atomic Weight}) \quad (i)$$

$$0 \leq Z \leq 5.0 \quad (ii)$$

This expression is the index which quantitatively expresses the balance between the three compounds since the phosphorus compound interacts with the magnesium compound as well as with titanium.

Expression (i) expresses the content of phosphorus which can act on the titanium compound and is obtained by subtracting the content of phosphorus which acts on the magnesium compound from the total content of reactive phosphorus. When the value Z is positive, the amount of phosphorus which interferes with titanium is surplus; and when the value Z is negative, the amount of phosphorus necessary for interfering with titanium is insufficient. Since one atom of Ti, Mg, and P are not equivalent to each other in the reaction, each molar weight in the expression is multiplied by the valence for weighting.

According to the present invention, a special synthesis or the like is not necessary, and polyester having superior color tone and resistance to coloring due to heat can be obtained using the titanium compound, the phosphorus compound, and the magnesium compound, which are inexpensive and easily available.

In Expression (ii), it is preferable that the expression of $1.0 \leq Z \leq 4.0$ be satisfied and it is more preferable that the expression of $1.5 \leq Z \leq 3.0$ be satisfied, from the viewpoint of further improving color tone and resistance to coloring due to heat while maintaining polymerization reactivity.

Examples of a preferable embodiment according to the present invention include an embodiment in which, before the completion of the esterification reaction, 1 ppm to 30 ppm of the chelate titanium complex having citric acid or citrate is added to the aromatic dicarboxylic acid and the aliphatic diol; 60 ppm to 90 ppm (more preferably 70 ppm to 80 ppm) of a magnesium salt of a weak acid is added in the presence of the chelate titanium complex; and then 60 ppm to 80 ppm (more preferably 65 ppm to 75 ppm) of the pentavalent phosphoric acid ester not having an aromatic ring as a substituent is added.

The esterification reaction can be performed under a condition of causing ethylene glycol to reflux using a multi-stage device in which at least two reactors are connected in series while discharging water and alcohol produced by the reaction to the outside of the system.

The above-described esterification reaction may be performed in a single step or multiple steps.

When the esterification reaction is performed in a single step, the esterification reaction temperature is preferably 230° C. to 260° C., and more preferably 240° C. to 250° C.

When the esterification reaction is performed in multiple steps, the esterification reaction temperature in a first reactor is preferably 230° C. to 260° C., and more preferably 240° C. to 250° C.; and the pressure is preferably 1.0 kg/cm² to 5.0 kg/cm², and more preferably 2.0 kg/cm² to 3.0 kg/cm². In a second reactor, the esterification reaction temperature is preferably 230° C. to 260° C., and more preferably 245° C. to 255° C.; and the pressure is preferably 0.5 kg/cm² to 5.0 kg/cm², and more preferably 1.0 kg/cm² to 3.0 kg/cm². Further, when the esterification reaction is performed in three or more steps, it is preferable that conditions of the esterification reaction in an intermediate step be set to intermediate values between those in a first reactor and a final reactor.

—Polycondensation—

In the polycondensation process, a polycondensate is obtained by polycondensating an esterified reaction product produced in the esterification reaction process. The polycondensation reaction may be performed in a single step or multiple steps.

The esterified reaction product such as oligomer generated in the esterification reaction process is subjected to the polycondensation reaction. The polycondensation reaction can be preferably performed by supplying the product to a multi-stage polycondensation reactor.

For example, when the polycondensation reaction is performed in three steps, it is preferable that polycondensation conditions be as follows: in a first reactor, the reaction temperature is preferably 255° C. to 280° C., and more preferably 265° C. to 275° C., and the pressure is preferably 100 torr to 10 torr ($13.3 \times 10^{-3}$ MPa to $1.3 \times 10^{-3}$ MPa), and more preferably 50 torr to 20 torr ($6.67 \times 10^{-3}$ MPa to $2.67 \times 10^{-3}$ MPa); in a second reactor, the reaction temperature is preferably 265° C. to 285° C., and more preferably 270° C. to 280° C., and the pressure is preferably 20 torr to 1 torr ($2.67 \times 10^{-3}$ MPa to $1.33 \times 10^{-4}$ MPa), and more preferably 10 torr to 3 torr ($1.33 \times 10^{-3}$ MPa to $4.0 \times 10^{-4}$ MPa); and in a third reactor which is the final reactor, the reaction temperature is preferably 270° C. to 290° C., and more preferably 275° C. to 285° C., and the pressure is preferably 10 torr to 0.1 torr ($1.33 \times 10^{-3}$ MPa to $1.33 \times 10^{-5}$ MPa), and more preferably 5 torr to 0.5 torr ($6.67 \times 10^{-4}$ MPa to $6.67 \times 10^{-5}$ MPa).

Additives such as a photostabilizer, an antioxidant, a ultraviolet ray absorbent, a flame retardant, a lubricant (fine particles), a nucleating agent (crystallizing agent), or a crystallization inhibitor may be further added to the polyester synthesized as above.

The moisture content of polyester, the crystallinity, the acid value of polyester, which is the concentration of a terminal carboxylic acid group of polyester, and the intrinsic viscosity, can be controlled by further performing solid phase polymerization after polymerization by the esterification reaction.

In particular, the intrinsic viscosity (IV) of polyester can be made to be from 0.7 to 0.9 by using the Ti catalyst in the esterification reaction and further performing the solid phase polymerization. Thereby, the crystallization of polyester can be easily suppressed in a process of cooling a molten resin in a manufacturing process of the polyester film substrate.

Therefore, the intrinsic viscosity of polyester which is a raw material of the polyester film substrate is preferably from 0.7 to 0.9.

In the solid phase polymerization of polyester, polyester polymerized in the above-described esterification reaction or commercially available polyester may be made into small pieces such as pellets and be used as a starting material.

(Formation of Coating Layer)

After preparing a polyester film substrate having an amount of a terminal carboxylic acid group (AV) of from 3 eq/ton to 20 eq/ton, a coating layer is provided on at least one surface of the polyester film substrate. The adhesion between the film substrate and the coating layer can be improved by providing the coating layer before stretching. It is considered that this configuration has an effect in which a temperature distribution derived from a distribution of drying degree of the coating solution is formed on the surface of the film substrate, crystals are thus nonuniformly formed in a stretching step performed after forming the coating layer, and thus the formation of the above-described crystallinity distribution is promoted.

Further, it is considered that an effect is also obtained in which a coating component and a chemical bond are formed by radicals which are generated by cracking molecules on the surface of the film substrate during stretching and the adhesion is more effectively improved.

Examples of a method of providing the coating layer on the surface of the film substrate include conventionally-known coating methods such as a bar coating method, a roll coating method, an knife edge coating method, a gravure coating method, and a curtain coating method.

In addition, before providing the coating layer, the film substrate may be subjected to a surface treatment (for example, flame treatment, corona treatment, plasma treatment, or UV treatment).

Depending on the application of a polyester film to be manufactured, it is preferable that the coating layer provided on the film substrate contain an acrylic resin, an urethane resin, a polyester resin, or a polyolefin resin. Since these resins have a polarity close to that of polyester, the adhesion force is easily obtained, which is preferable.

Examples of the resin contained in the coating layer include resins used for a coating solution which forms an easy adhesive layer or the like on the surface of the polyester film substrate, for example, those described in JP-A No. 2006-152013, JP-A No. 2006-332091, Japanese Patent No. 4457322, JP-A-2006-175764, JP-A-2006-253565, Japanese Patent No. 4547644, Japanese Patent No. 3777725, Japanese Patent No. 3731286, JP-A No. 2009-269301, and JP-A No. 2006-335853. More specifically, examples of the resin are as follows.

—Urethane Resin—

For example, a thermally reactive water-soluble urethane resin which has a blocked isocyanate group and in which a terminal isocyanate group is sealed (hereinafter, also referred to as "blocked") with a hydrophilic group may be used. Examples of a blocking agent for sealing the isocyanate group with a hydrophilic group include bisulfites, phenols containing a sulfonic acid group, alcohols containing a sulfonic acid group, lactams containing a sulfonic acid group, oximes containing a sulfonic acid group, and active methylene compounds containing a sulfonic acid group. The blocked isocyanate group make a urethane prepolymer hydrophilic or water-soluble. When heat energy is applied to the polyurethane resin, the blocking agent is dissociated from the isocyanate group. The polyurethane resin then fixes a water-dispersible copolyester resin mixed thereto to a self-crosslinking portion thereof and reacts with a terminal group and the like of the copolyester resin. Since the resin during the preparation of the coating solution is hydrophilic, the water resistance is low. However, when terminal reaction is completed after coating and drying, the hydrophilic group of the urethane resin, that is, the blocking agent is dissociated, thereby obtaining a water-resistant coating layer. Among the above-described examples of the blocking agent, bisulfites are most preferable from the viewpoints that the blocking agent is dissociated from the isocyanate group depending on the heat treatment temperature and the heat treatment time of the film manufacturing process and that they are industrially available.

The chemical composition of the urethane prepolymer which is used in the above-described resin is (1) an organic polyisocyanate having two or more active hydrogen atoms in the molecules, or a compound having at least two or more active hydrogen atoms in the molecules and a molecular weight of 200 to 20,000; (2) an organic polyisocyanate having two or more isocyanate groups in the molecules; or (3) a compound having a terminal isocyanate group obtained by reaction of a chain extending agent having at least two or more active hydrogen atoms in the molecules.

Generally-known examples of the compound (1) include compounds having two or more hydroxyl groups, carboxyl groups, amino groups, or mercapto groups at a terminal or in the molecules. Particularly preferable examples of the compound include polyether polyols, polyester polyols, and polyether ester polyols. Examples of the polyether ester polyols include alkylene oxides such as ethylene oxide and propylene oxide; compounds obtained by polymerization of styrene oxide, epichlorohydrin and the like; compounds obtained by random copolymerization or block copolymerization of two or more kinds of the above-described compounds; and compounds obtained by addition polymerization of the above-described compounds with polyol.

—Polyester Resin—

The polyester resin is formed from: a polybasic acid as described below or an ester forming derivative thereof; and a polyol as described below or an ester forming derivative thereof. Examples of the polybasic acid component include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid, and 5-sodiumsulfoisophthalic acid. A copolyester resin is synthesized by using, preferably, two or more kinds of these acid components. In addition, maleic acid, itaconic acid or a hydroxycarboxylic acid such as p-hydroxybenzoic acid may also be used in combination as an unsaturated polybasic acid component as long as its amount is small. Examples of the polyol component include ethylene glycol, 1,4-butanediol, diethylene glycol, dipropylene glycol, 1,6-hexanediol, 1,4-cyclohexane dimethanol, xylene glycol, dimethylolpropane, poly(ethylene oxide)glycol, and poly(tetramethylene oxide)glycol.

—Acrylic Resin—

Examples of the acrylic resin include acrylic resins obtained by polymerization of the following exemplary acrylic monomers. Examples of such acrylic monomers include alkyl acrylate and alkyl methacrylate (examples of an alkyl group thereof include a methyl group, an ethyl group, an n-propyl group, an isopropyl group, an n-butyl group, an isobutyl group, a t-butyl group, a 2-ethylhexyl group, and a cyclohexyl group); hydroxyl group-containing monomers such as 2-hydroxyethyl acrylate, 2-hydroxyethyl methacrylate, 2-hydroxypropyl acrylate, and 2-hydroxypropyl methacrylate; epoxy group-containing monomers such as glycidyl acrylate, glycidyl methacrylate and allyl glycidyl ether; monomers having a carboxyl group, a sulfoxy group, or a salt thereof such as acrylic acid, methacrylic acid, itaconic acid, maleic acid, fumaric acid, crotonic acid, styrenesulfonic acid and salts thereof (for example, sodium salts, potassium salts, ammonium salts, and tertiary amine salts); amide group-containing monomers such as acrylamide, methacrylamide, N-alkylacrylamide, N-alkylmethacrylamide, N,N-dialkylacrylamide, N,N-dialkylmethacrylamide (examples of an alkyl group include a methyl group, an ethyl group, an n-propyl group, an isopropyl group, an n-butyl group, an isobutyl group, a t-butyl group, a 2-ethylhexyl group, and a cyclohexyl group), N-alkoxyacrylamide, N-alkoxymethacrylamide, N,N-dialkoxyacrylamide, N,N-dialkoxymethacrylamide (examples of an alkoxy group include a methoxy group, an ethoxy group, a butoxy group, and an isobutoxy group), acryloyl morpholine, N-methylolacrylamide, N-methylolmethacrylamide, N-phenylacrylamide, and N-phenylmethacrylamide; monomers of acid anhydrides such as maleic anhydride and itaconic anhydride; and monomers such as vinyl isocyanate, allyl isocyanate, styrene, α-methylstyrene, vinyl methyl ether, vinyl ethyl ether, vinyl trialkoxysilane, alkyl maleic acid monoesters, alkyl fumaric acid monoesters, alkyl itaconic acid monoesters, acrylonitrile, methacrylonitrile, vinylidene chloride, ethylene, propylene, vinyl chloride, vinyl acetate, and butadiene.

Among these, it is preferable that a content of the hydroxyl group-containing monomers such as 2-hydroxyethyl acrylate, 2-hydroxyethyl methacrylate, 2-hydroxypropyl acrylate, and 2-hydroxypropyl methacrylate, N-methylolacrylamide, and N-methylolmethacrylamide be from 2 mol % to 20 mol %, and preferably from 4 mol % to 15 mol %.

The coating solution may further contain a wetting agent, an antistatic agent, a colorant, a surfactant, or an ultraviolet ray absorbent. When the coating solution contains a wetting agent, a content thereof is, for example, 1% by mass to 20% by mass with respect to the solid content.

In addition, a polyolefin resin, for example, a rubber resin such as SBR, is also preferable for the coating layer. When the coating layer contains such a polyolefin resin, separation stress is easily absorbed due to its flexible structure and thus the adhesion forces can be improved. Examples thereof include those described in JP-A No. 61-60424, JP Patent No. 2583455, JP Patent No. 3626305, JP Patent No. 3783989, JP Patent No. 4041784, and JP Patent No. 4505402.

A polyvinyl alcohol (PVA) resin is also preferably used as the polyolefin resin. This is because, when the polyester film manufactured with by method according to the present invention is used as a back sheet for a solar cell and a coating layer containing a PVA resin is provided, the coating layer has high affinity for the polyvinyl alcohol resin layered thereon.

Furthermore, it is also preferable that a crosslinking compound (crosslinking agent) be present together in the coating layer. As a result, the crosslinking compound is crosslinked in the coating layer or with polyester, and thus the adhesion strength can be improved. Examples of the crosslinking compound include epoxy compounds, glycidyl compounds, melamine compounds, and oxazoline compounds.

In addition, when the coating layer contains the crosslinking agent, humidity resistance can be further improved. In a case where the crosslinking agent is used, when the content thereof is less than 5% by mass, it is difficult to exhibit the effect of improving humidity resistance; on the other hand, when the content is larger than 20% by mass, it is difficult to form the coating layer and thus the adhesion with EVA deteriorates, which is not preferable.

In addition to the crosslinking agent, another compound having an epoxy group may be used in combination. Examples of such a compound include polyepoxy compounds such as sorbitol polyglycidyl ether, polyglycerol polyglycidyl ether, pentaerythritol polyglycidyl ether, diglycerol polyglycidyl ether, triglycidyl tris(2-hydroxyethyl)isocyanate, glycerol polyglycidyl ether, and trimethylol propane polyglycidyl ether; diepoxy compounds such as neopentyl glycol diglycidyl ether, 1,6,hexanediol diglycidyl ether, resorcin diglycidyl ether, ethylene glycol diglycidyl ether, polyethylene glycol diglycidyl ether, propylene glycol diglycidyl ether, polypropylene glycol diglycidyl ether and polytetramethylene glycol diglycidyl ether; and monepoxy compounds such as allyl glycidyl ether, 2-ethylhexyl glycidyl ether and phenyl glycidyl ether.

When the epoxy compound is used in combination with the crosslinking agent, the total amount of the crosslinking agent and the epoxy compound is preferably from 5% by mass to 20% by mass with respect to the solid content of the coating solution.

When the coating solution contains relatively great amounts of fine particles, the crosslinking agent, and a wetting agent in cases, the total amount of the solid content can be made to 100% by mass by relatively reducing the amount of a polymer binder.

Before providing the coating layer, the polyester film substrate may be subjected to a surface treatment, examples thereof including corona treatment, flame treatment, UV treatment, glow treatment, and atmospheric plasma treatment.

The thickness of the coating layer after stretching in the polyester film according to the present invention is preferably from 0.05 μm to 1.5 μm, more preferably from 0.1 μm to 1.0 μm, and still more preferably from 0.2 μm to 0.7 μm. When the thickness of the coating layer is less than 0.05 μm, the adhesion with the film substrate may easily deteriorate. In addition, when the thickness of the coating layer is larger than 1.5 μm, the coating layer deteriorates over time at a specific temperature, cracking easily occurs in the coating layer, and the adhesion force may easily deteriorate.

(Stretching)

Next, the polyester film substrate on which the coating layer is formed is stretched at least once.

When the coating layer is formed on the surface of the film substrate and then stretching is performed, many active sites are generated along with the cracking of molecules present on the surface and thus the adhesion force can be improved.

The stretching may be performed after providing the coating layer on the surface of an unstretched film which has been melt-extruded, or the stretching may be performed, after the coating layer is formed on a surface of a film which has been provided by stretching (longitudinal stretching or transverse stretching) an unstretched film in one direction, in the same direction or the other direction.

For example, after the polyester resin is melt-extruded to obtain a melt, the melt passes through a gear pump, a filter, a die, and the like and then is casted on a cooling drum to form an unstretched film (film substrate).

Next, the unstretched film is stretched in at least one of longitudinal and transverse directions. At this time, the coating layer is provided on the polyester film substrate and then stretching is performed. When stretching is performed in the presence of water vapor, it is preferable that the water vapor has a concentration distribution of preferably from 5% to 30%, more preferably from 6% to 25%, and still more preferably from 7% to 20%, during the stretching.

In addition, the average concentration during stretching (average value of water vapor concentrations at inlet and outlet of a stretching portion represented by the mass of water vapor per 1 $Nm^3$ of air) is preferably from 0.1 $g/Nm^3$ to 50 $g/Nm^3$, more preferably from 0.3 $g/Nm^3$ to 20 $g/Nm^3$, and still more preferably from 0.5 $g/Nm^3$ to 10 $g/Nm^3$.

When water vapor is present during stretching, polyester in contact with water vapor is plasticized, the mobility of molecules is increased, and the crystal formation is promoted. At this time, when there is a distribution (unevenness) in water vapor concentration, portions where crystallization easily advances and portions crystallization slowly advances are present and thus the crystallinity distribution according to the present invention can be achieved. Such an effect of water vapor is easily obtained particularly during stretching. The reason is that molecules are in the process of being arranged along with stretching; and therefore, when plasticizing is performed by moisture at this time, crystallization rapidly advances and the crystallinity distribution is easily imparted.

Such a water vapor treatment during stretching may be performed when an unstretched film is stretched or during stretching. "During stretching" represents the treatment being performed, for example, during longitudinal stretching, during transverse stretching, or during longitudinal stretching and transverse stretching. Among these, it is most preferable that the treatment be performed during longitudinal stretching and transverse stretching. During longitudinal stretching, when molecules are arranged to some degree and rearranged by transverse stretching, the molecules greatly move. At this time, the molecules are exposed to water vapor to impart a difference in the mobility, thereby easily forming the crystallinity distribution. Another organic solvent vapor such as alcohol, ester, or ketone vapor may be included in water vapor.

In order to impart such a concentration distribution of water vapor, for example, a casing is provided in a stretching zone, a blowing port is provided in the casing to blow gas (for example, air or nitrogen gas) containing water vapor, and the blowing speed thereof is made to vary. In addition, it is also effective that the blowing port is deviated from the center of the casing to form a concentration distribution in the casing.

When the concentration distribution of water vapor during stretching is less than 5%, the crystallization of the film slowly advances and thus it is difficult to form the crystallinity distribution. When the concentration distribution of water vapor is larger than 30%, the crystallization of the film excessively advances and thus it is difficult to form the crystallinity distribution.

The thickness of the polyester film obtained after stretching (film substrate provided with the coating layer) is preferably from 30 μm to 350 μm, more preferably from 40 μm to 310 μm, and still more preferably from 45 μm to 300 μm.

When the thickness of the polyester film is less than 350 μm, the bending strength deteriorates and cracks may be easily generated during handling, which may cause deterioration in the adhesion strength between the film substrate and the coating layer. On the other, when the thickness of the polyester film is larger than 350 μm, the stretching amount of the film surface during bending may become excessive, cracks may be generated in the coating layer, which may cause deterioration in the adhesion.

A method of stretching the film substrate may be uniaxial stretching or biaxial or multiaxial stretching. Biaxial stretching refers to a method including at least one stretching in each direction of two different directions.

From the viewpoints of the strength and shape stability of the obtained polyester film, it is preferable that biaxial stretching be performed in which stretching in a machine direction (MD) of the polyester film substrate, that is longitudinal stretching, and stretching in a transverse direction (TD) perpendicular to the machine direction, that is transverse stretching, be performed.

A biaxial stretching method may be either a sequential biaxial stretching method of separately performing longitudinal stretching and transverse stretching or a simultaneous biaxial stretching method of simultaneously performing longitudinal stretching and transverse stretching.

Longitudinal stretching and transverse stretching may be performed twice or more irrespective of each other, in which the order of longitudinal stretching and transverse stretching is arbitrary. Examples of a stretching configuration include: longitudinal stretching→transverse stretching; longitudinal stretching→transverse stretching→longitudinal stretching; longitudinal stretching→longitudinal stretching→transverse stretching; and transverse stretching→longitudinal stretching. Among these, longitudinal stretching→transverse stretching is preferable.

"Direction (TD) perpendicular to the machine direction (MD) of the polyester film substrate" during transverse refers to the direction which is perpendicular to or substantially perpendicular to the machine direction (MD) of polyester by an angle (90°±5°).

During longitudinal and transverse stretching, an area stretching ratio (product of respective stretching ratios) of the polyester film substrate is from 6 times to 18 times, more preferably from 8 times to 16 times, and still more preferably from 10 times to 15 times, with respect to the area of the polyester film substrate before stretching.

During longitudinal stretching and transverse stretching, the temperature during the stretching (stretching temperature) of the polyester film substrate is preferably (Tg−20)° C. to (Tg+50)° C., more preferably from (Tg−10)° C. to (Tg+40)° C., and still more preferably from Tg to (Tg+30)° C., in which the glass transition temperature of the polyester film substrate being represented by Tg.

During stretching, when stretching is performed using a roll such as a nip roll as means for heating the polyester film substrate, the polyester film substrate in contact with the roll can be heated by providing, inside the roll, a heater or a pipe through which a heated solvent flows. In addition, even in a case where a roll is not used, the polyester film substrate can be heated by blowing the polyester film substrate with warm air, bringing the polyester film substrate in contact with a heat source such as a heater, or passing the polyester film substrate through the vicinity of a heat source.

During the stretching of the polyester film substrate, it is preferable that heat setting be performed after biaxial stretching which is a combination of longitudinal stretching and transverse stretching. The heat setting temperature is preferably from 160° C. to 250° C., more preferably from 170° C. to 240° C., and still more preferably from 180° C. to 220° C.

In addition, after heat setting, it is preferable that relaxation be performed in at least one of directions of longitudinal stretching and transverse stretching by preferably 1% to 20%, more preferably 3% to 15%, and still more preferably 4% to 10%.

Evaluation methods, measurement methods, and the like for properties relating to the present invention will be described hereinbelow.

(1) Amount of Terminal Carboxylic Acid Group (AV)

The amount of terminal COOH is the value calculated from a titer which is obtained by completely dissolving polyester in a mixed solvent (benzyl alcohol/chloroform=2/3; volume ratio) and performing titration with a standard solution (mixed solution of 0.025 N KOH and methanol) in which phenol red is used as an indicator.

(2) Intrinsic Viscosity (IV)

The intrinsic viscosity (IV) is the value obtained by: subtracting 1 from a ratio $\eta_r$ of a solution viscosity ($\eta$) to a solvent viscosity ($\eta_0$)($\eta/\eta_0$; relative viscosity) to obtain a specific viscosity ($\eta_{sp}=\eta_r-1$); dividing the specific viscosity by a concentration; and extrapolating the value to a state where the concentration is zero. The IV is obtained from the solution viscosity of a mixed solution (1,1,2,2-tetrachloroethane/phenol=2/3 (mass ratio)) at 30° C.

(3) Pre-Melting Peak (Tm')

10 mg of sample is put into a sample pan and is heated to 300° C. at 10° C./min.

Among endothermic peaks appearing in a range of 200° C. to 265° C., a peak at the second highest temperature following the endothermic peak at the highest temperature (Tm) is set to a pre-melting peak (Tm').

This measurement is performed for 10 pellets which are arbitrarily selected, and a difference between the highest temperature and the lowest temperature of Tm' is set to a temperature distribution of Tm'. An average value of Tm' refers to an average value of Tm' of the 10 pellets.

(4) Amount of Ti Element 5 wt % of polyester film is dissolved in HFIP (hexafluoroisopropanol), followed by centrifugation at 1000 rpm. The Ti amount in the supernatant solution thereof is measured using atomic absorption spectrometry. Solid matter such as $TiO_2$ is removed by the centrifugation to measure the amount of a Ti catalyst.

(5) Crystallinity Distribution

A sample is arbitrarily cut into a 30 cm×30 cm-square film. 2 cm×5 cm-samples are cut out from portions centering on intersections of lines which are drawn parallel to one side (A side) from points 5 cm, 15 cm, or 25 cm apart from an end of the A side and lines which are drawn parallel to the other side (B side), which is perpendicular to the A side, from points 7.5 cm or 22.5 cm apart from an end of the B side. At this time, the samples are prepared so that the 5 cm-sides are parallel to the A side.

These six samples are mounted to a multipath reflection type ATR-IR crystallite (KRS-5, incident angle: 45°), and measurement using FT-IR is performed 100 times.

The crystalline band strength of each of the six samples is obtained using the following expression.

$$\text{Crystalline Band Strength} = \text{Absorption at 1341 cm}^{-1} / \text{Absorption at 1410 cm}^{-1}$$

*The band at 1341 cm$^{-1}$ is derived from a trans structure of a ethylene glycol residue and is in proportion to the crystallinity. The peak of the band at 1410 cm$^{-1}$ pertains to a benzene ring. Normalization is performed by division using the value at 1410 cm$^{-1}$.

Among crystallinity band strength values of the 6 measurement points, a difference between the maximum value and the minimum value is divided by the average value and is expressed in percentage. The obtained value is referred to as the crystallinity distribution. In addition, the average value of the six samples is regarded as the average crystal band strength.

(6) EG Gas Concentration

The EG gas concentration is measured using a gas detecting tube (for example, KITAGAWA GAS DETECTING TUBE manufactured by Komyo Rikagaku Kogyo K.K.).

(7) Water Vapor Concentration

The water vapor concentration is obtained by measuring the dew point using, for example, a capacitance dew point meter MOISTURE MONITOR SERIES 3 (manufactured by GE Sensing Inc.).

<Back Sheet for Solar Cell>

The application of the polyester film according to the present invention is not particularly limited, but is desirable for the application such as a back sheet for a solar cell or a barrier film substrate.

Examples of a configuration for the application of a solar cell module include a configuration in which a power generation element (photovoltaic element) connected to a lead wiring (not illustrated) for extracting the electricity is sealed with an encapsulant such as ethylene-vinyl acetate (EVA) copolymer resin; and the resultant is held between a transparent substrate such as glass and the polyester film (back sheet) according to the present invention, followed by bonding.

Examples of the photovoltaic element include various known photovoltaic elements including silicon elements such as single-crystalline silicon, polycrystalline silicon, and amorphous silicon; and III-V group or II-VI group compound semiconductors such as copper-indium-gallium-selenide, copper-indium-selenide, cadmium-telluride, and gallium-arsenide.

By using a back sheet for a solar cell including the polyester film according to the present invention, the adhesion with an encapsulant such as EVA is maintained for a long period of time. As a result, an ultra long-lifetime solar cell module can be obtained.

EXAMPLES

The present invention will be described in further detail using examples hereinafter. However, the present invention is not limited the following examples as long as the spirit of the present invention is not departed. "Part(s)" and "%" represent "part(s) by mass" and "% by mass" unless specified otherwise.

Examples 1 to 67 and A to C and Comparative Examples 1 to 5 and A and B (1) Manufacture of Polyester Resin (1-1) Polymerization of Polyester
(A) Ti Catalyst PET Polyester was polymerized as follows according to Example 1 of JP-A No. 2007-70462. At this time, the amount of the Ti catalyst was changed as shown in Table 1.
(B) Sb Catalyst PET:

Polyester was obtained as follows according to "Raw Material PET-1" described in paragraph [0054] of Pamphlet of International Publication WO 2010/110119A1.

A mixture of 100% by mass of dimethyl terephthalate and 60% by mass of ethylene glycol was added to 0.08% by mass of calcium acetate and 0.03% by mass of antimony trioxide, followed by heating using an ordinary method and ester exchange reaction.

Next, 0.16% by mass of lithium acetate and 0.11% by mass of trimethyl phosphate were added to a reaction product of the ester exchange reaction. The resultant was poured into a polymerization reaction bath and the pressure of the reaction system was gradually reduced to 1 mmHg while heating the reaction system, followed by polymerization using an ordinary method at 290° C. As a result, polyester (polyethylene terephthalate) having an intrinsic viscosity of 0.52 was obtained.
(C) Al Catalyst PET A PET sample was obtained according to the following method.

High-purity terephthalic acid and ethylene glycol and triethylamine having a molar quantity twice that of the terephthalic acid were added to a heat medium circulation type (2 liter) stainless steel autoclave equipped with a stirrer such that a content thereof was 0.3 mol % with respect to acid components, followed by esterification reaction under an increased pressure of 0.25 MPa and at 245° C. for 120 minutes while discharging water to the outside of the system. As a result, an oligomer mixture was obtained. An aqueous aluminum subacetate (manufactured by Sigma-Aldrich Co., LLC.) solution as a polycondensation catalyst and ethylene glycol were added to the oligomer mixture, followed by reflux. As a result, 15 g/l of ethylene glycol solution of aluminum subacetate was added such that a content of aluminum atoms was 0.014 mol % with respect to acid components in polyester; and 10 g/l of ethylene glycol solution of IRGANOX 1425 (manufactured by Ciba Specialty Chemicals Inc.) as a phosphorous compound was added such that a content of IRGANOX 1425 was 0.02 mol % with respect to acid components. Next, stirring was performed at 245° C. for 10 minutes in an nitrogen atmosphere under ordinary pressure. Then, the pressure of the reaction system was gradually reduced to 13.3 Pa (0.1 Torr) while heating the reaction system to 275° C. for 60 minutes. Furthermore, polycondensation reaction was performed at 275° C. and 13.3 Pa until a desired IV was obtained. When a predetermined stirring torque was reached, nitrogen gas was introduced into the autoclave to return the pressure to ordinary pressure and the polycondensation reaction was stopped.

(D) Addition of "≥Trifunctional Component"

During the polymerization process, a "trifunctional component" selected from the following compounds was added to the dicarboxylic acid component and the diol component of the raw material composition in an amount shown in Table 1. The addition amount herein refers to mol % with respect to the total content of the dicarboxylic acid component and the diol component.

Trifunctional carboxylic acid type: trimellitic acid (referred to as TMA in Table 1)

Tetrafunctional carboxylic acid type: benzenetetracarboxylic acid (referred to as BTC in Table 1)

Pentafunctional carboxylic acid type: ethanepentacarboxylic acid (referred to as EPC in Table 1)

Hexafunctional carboxylic acid type: cyclohexanehexacarboxylic acid (referred to as CHC in Table 1)

Trifunctional hydroxyl group type: trihydroxybenzene (referred to as THB in Table 1)

Tetrafunctional hydroxyl group type: pentaerythritol (referred to as PE in Table 1)

(1-2) Solid Phase Polymerization

The above-described resin (pellet) was dried at an average temperature and a temperature distribution shown in Table 1 for 5 hours.

After drying, the pellet was put into a solid phase bath at a temperature shown in Table 1 and then EG having a concentration shown in Table 1 and $N_2$ gas containing water vapor were introduced into the solid phase polymerization bath at 1 $Nm^3$/hr per 1 kg of the resin. At this time, the solid phase polymerization time and the concentrations of water vapor and EG were controlled as shown in Table 1. The solid phase polymerization time was as shown in Table 1.

The Tm' of the solid phase-polymerized pellet obtained as above was measured according to the above-described method. The results thereof are shown in Table 1.

(2) Preparation of Polyester Film Substrate
(Unstretched Film)

The solid phase-polymerized resin was dried again to obtain a moisture content of 100 ppm or less, and a terminal blocking agent was selected from the following compounds and was added in an amount shown in Table 1. The addition amount herein refers to % by mass with respect to the polyester resin.

(a) Carbodiimide compound: STABAXOL P100 manufactured by Rhein Chemie Rheinau GmbH (referred to as "CI" in the table")

(b) Epoxy Compound: "CARDURA E10P" manufactured by Hexion Specialty Chemicals, Inc. (referred to as "EP" in the table)

(c) Oxazoline compound: "EPOCROSS RPS-1005" manufactured by Nippon Shokubai Co., Ltd. (referred to as "OX" in the table)

Using a biaxial extruder provided with screws having a diameter shown in Table 1, melt kneading was performed at 280° C. under nitrogen stream. This melt was extruded onto a chilled roll through a gear pump, a filter, and a die, to prepare an unstretched film.

(3) Stretching and Formation of Coating Layer

The obtained unstretched film was subjected to stretching and coating according to the following order. Respective conditions for stretching and coating are shown in Table 2. In the case of both-surface coating, both surfaces are coated with the same coating solution in the same coating amount.

Order #1: longitudinal stretching→single-surface coating→transverse stretching

Order #2: longitudinal stretching→longitudinal stretching→single-surface coating→transverse stretching Order #3: longitudinal stretching→single-surface coating→transverse stretching→transverse stretching Order #4: longitudinal stretching→single-surface coating→longitudinal stretching→transverse stretching Order #5: longitudinal stretching→transverse stretching→single-surface coating→transverse stretching Order #6: longitudinal stretching→both-surface coating→transverse stretching The longitudinal stretching, the stretching ratio was 3.5 times at 90° C., and in the transverse stretching, the stretching ratio was 3.8 times at 120° C. When the longitudinal stretching was performed in two steps, the stretching ratio was set to 1.5 times in the first step and 2.3 times in the second step. When the horizontal stretching was performed in two steps, the stretching ratio was set to 1.9 times in the first step and 2.0 times in the second step.

During stretching, a concentration distribution of water vapor shown in Table 2 was imparted. Specifically, a casing was provided on a stretching machine and warm air was blown therethrough so as to obtain the above-described stretching temperature. Water vapor was added to this warm air. At this time, plural warm air blowing ports are provided and a water vapor concentration is varied depending on each blowing ports, thereby imparting a water vapor concentration distribution. The water vapor concentration distribution was measured according to the above-described method at arbitrary 10 points of the casing, the average value is divided by a difference between the maximum value and the minimum value, and the obtained value is expressed in percentage.

Coating was performed immediately after stretching. The film substrate before coating was sampled and the AV and IV thereof were measured according to the above-described method.

In addition, the surface of the film substrate before coating was subjected to corona treatment to suppress cissing during coating.

When the coating layer was formed, the surface of the polyester film substrate was coated with the coating solution such that the thickness of the dried coating layer after the completion of all the stretching steps was 0.5 µm. Coating was performed using a bar coating method.

The configuration of each resin which was used in the coating solution for forming the coating layer shown in Table 2 is as follows.

Acrylic Resin: A-1
Acrylic resin (Tg=27° C.) including:
methyl methacrylate 55 mol %;
ethyl acrylate 40 mol %;
N-methylolacrylamide 3 mol %; and
2-hydroxyethyl methacrylate 2 mol %.
Urethane Resin: U-1
Polyester base resin+(isophorone diisocyanate/xylene diisocyanate) curing agent
Urethane Resin: U-2
Water 51.00% by mass
Isopropanol 30.00% by mass
Polyurethane resin 12.58% by mass (polyurethane resin prepared according to the following method)
Resin having an oxazoline group 4.72% by mass (oxazoline resin prepared according to the following method)
Particles 1.57% by mass (silica sol having an average particle size of 40 nm, solid content concentration: 40% by mass)
Particles 0.08% by mass (silica sol having an average particle size of 450 nm, solid content concentration: 40% by mass)
Surfactant 0.05% by mass (KF6011 manufactured by Shin-Etsu Chemical Co., Ltd., silicon surfactant, solid content concentration: 100% by mass)

(Preparation of Polyurethane Resin)

43.75 parts by mass of 4,4-diphenylmethane diisocyanate, 12.85 parts by mass of dimethylol butane acid, 153.41 parts by mass of polyhexamethylene carbonate diol having a number average molecular weight of 2000, 0.03 parts by mass of dibutyl tin dilaurate, and 84.00 parts by mass of acetone as a solvent were put into a four-necked flask provided with a stirrer, a Dimroth condenser, a nitrogen gas introduction pipe, a silica gel dry pipe, and a thermometer, followed by stirring at 75° C. for 3 hours in a nitrogen atmosphere. It was confirmed that the reaction solution reached a predetermined amine equivalent. Next, this reaction solution was cooled to 40° C. and 8.77 parts by mass of triethylamine was added thereto to obtain a polyurethane prepolymer solution. Next, 450 g of water was added to a reaction vessel provided with a homodisperser capable of high-speed stirring and the temperature was adjusted to 25° C. The polyurethane prepolymer solution was added thereto while performing stirring and mixing at 2000 min$^{-1}$ so as to be dispersed in water. Then, a part of acetone and water under reduced pressure was removed to prepare a water-soluble polyurethane resin having a solid content of 35%. The glass transition temperature of the obtained polyurethane resin was −30° C.

(Preparation of Resin having Oxazoline Group)

A mixture of 58 parts by mass of ion exchange water as an aqueous medium and 58 parts by mass of isopropanol, and 4 parts by mass of polymerization initiator (2,2′-azobis(2-amidinopropane)dihydrochloride) were added to a flask provided with a thermometer, a nitrogen gas introduction pipe, a reflux condenser, a dropping funnel, and a stirrer. Meanwhile, 16 parts by mass of 2-isopropenyl-2-oxazoline as a polymerizable unsaturated monomer having an oxazoline group, 32 parts by mass of methoxy polyethylene glycol acrylate (average molar number of added ethylene glycol: 9 mole, manufactured by Shin-Nakamura Chemical Co., Ltd.), and 32 parts by mass of methyl methacrylate were added to the dropping funnel, followed by dropwise addition at 70° C. for 1 hour in a nitrogen atmosphere. After the dropwise addition, the reaction solution was stirred for 9 hours and cooled. As a result, a water-soluble resin having an oxazoline group in which the solid content concentration was 40% by mass was obtained.

Urethane Resin: U-4

A coating solution (concentration: 10%) having water as a medium was prepared such that the solid contents of the following compounds (1) to (4) have the following number of parts.

(1) Polyurethane HYDRAN AP-40 (trade name) manufactured by DIC Corporation 60% by mass
(2) Polyurethane PERMALIN UA310 (trade name) manufactured by Sanyo Chemical Industries Ltd. 10% by mass
(3) Polyester FINETEX ES-670 manufactured by DIC Corporation 20% by mass
(4) Alkylol Melamine 10% by mass Polyester Resin: E-1

Crosslinking agent: polymer (Tg=50° C.) having an oxazoline group and being formed from 30 mol % of methyl methacrylate, 30 mol % of 2-isopropenyl-2-oxazoline, 10 mol % of polyethylene oxide (n=10) methacrylate, and 30 mol % of acrylamide.

Resin component: copolyester (Tg=43° C.) in which the acid components are formed from 80 mol % of terephthalic acid, 15 mol % of isophthalic acid, and 5 mol % of 5-sodiumsulfoisophthalic acid and the glycol components are formed from 60 mol % of ethylene glycol and 40 mol % of diethylene glycol.

Filler: silica particles having an average particle size of 60 nm

Wetting agent: polyoxyethylene (n=7) lauryl ether

The mixing ratios of these compounds were set to "Crosslinking Agent:Other Resins:Filler:Wetting Agent"=15% by mass:75% by mass:4% by mass:6% by mass.

Polyester Resin: E-2

The following coating agents were mixed to prepare a coating solution. Particles A are SnO$_2$ particles having a refractive index of 2.1 and particles B are silica particles having an average primary particle size of approximately 500 nm.

Water 40.16% by mass
Isopropanol 30.00% by mass
Aqueous polyester dispersion 18.19% by mass (aqueous polyester dispersion prepared according to the following method)
Aqueous blocked polyisocyanate solution 2.08% by mass (ELASTRON E-37 manufactured by Dai-Ichi Kogyo Seiyaku Co., Ltd.)
Particles A 9.37% by mass (CELAMASE S-8 manufactured by Taki Chemical Co., Ltd., solid content concentration: 8% by mass)
Particles B 0.17% by mass (SEAHOSTAR KEW 50 manufactured by Nippon Shokubai Co., Ltd., solid content concentration: 15% by mass)
Silicon surfactant 0.03% by mass (DC57 manufactured by Dow Corning Corporation, solid content concentration: 100% by mass)

(Preparation of Aqueous Polyester Dispersion)

30 parts by mass of the following polyester resin (a-1) and 15 parts by mass of ethylene glycol n-butyl ether were put into a reactor provided with a stirrer, a thermometer, and a reflux device, followed by heating and stirring at 110° C. to dissolve the resin. After completely dissolving the resin, 55 parts by mass of water was gradually added to the polyester solution under stirring. After the addition, the solution was cooled to room temperature under stirring. As a result, a milky white aqueous polyester dispersion having a solid content of 30% by mass was obtained.

(Preparation of the Polyester Resin (a-1))

194.2 parts by mass of dimethyl terephthalate, 184.5 parts by mass of dimethyl isophthalate, 14.8 parts by mass of dimethyl-5-sodium sulfo isophthalate, 233.5 parts by mass of diethylene glycol, 136.6 parts by mass of ethylene glycol, and 0.2 parts by mass of tetra-n-butyl titanate were put into a stainless steel autoclave provided with a stirrer, a thermometer, and a partial reflux condenser, followed by ester exchange reaction in a range of 160° C. to 220° C. for 4 hours. Next, the temperature was raised to 255° C. and the pressure was gradually reduced in the reaction system. The reaction was continued at a reduced pressure 30 Pa for 1 hour 30 minutes. As a result, the copolyester resin (a-1) was obtained. The obtained copolyester resin (a-1) was light yellow and transparent. The measured reduced viscosity of the obtained copolyester resin (a-1) was 0.70 dl/g. The glass transition temperature was 40° C. when measured by DSC.

Polyester Resin: E-3

Coating solution including a modified polyester polymeric binder FS-44 manufactured by Nippon Kako Toryo Co., Ltd., an isocyanate crosslinking agent as a TD curing agent, and a lubricant MP-300 manufactured by Soken Chemical Engineering Co., Ltd.

Polyester Resin: E-5

—Acid Components—

Terephthalic acid 32.8% by mass

Isophthalic acid 10.5% by mass

Trimellitic acid 14.7% by mass

Sebacic acid 4.3% by mass

—Glycol Components—

Ethylene glycol 6.5% by mass

Neopentyl glycol 13.1% by mass 1.4-butandiol 18.1% by mass

Ammonium salt-type aqueous dispersion of polyester resin (Tg: 20° C.) formed from the above-described acid components and glycol components.

Polyester Resin: E-6

Coating solution having a solid content concentration of 14.6% by mass in which an aqueous polyester (VYLONAL, manufactured by Toyobo Co., Ltd.), an aqueous blocked polyisocyanate compound B (sulfite blocked, manufactured by Dai-Ichi Kogyo Seiyaku Co., Ltd.), an aqueous blocked polyisocyanate compound C (ELASTRON BN11, manufactured by Dai-Ichi Kogyo Seiyaku Co., Ltd.), and a semipolar organic boron compound (HIBORON, manufactured by Boron International Co., Ltd.) as an antistatic agent were mixed at a solid content mass ratio of 30:33:3:34 and the solvent mass ratio was water:isopropanol=93:7.

PVA Resin: V-1

Aqueous coating solution in which a content of polyvinyl alcohol (polyvinyl alcohol having a gelation degree of from 86 mol % to 89 mol %) was 20% by mass, fine particles (spherical silica particles having an average particle size of 100 nm), and a concentration of and a crosslinking agent (compound represented by the following formula) was 8%.

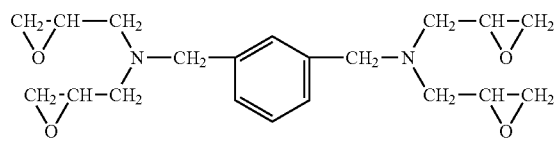

After stretching and forming the coating layer, a heat setting treatment was performed at a temperature shown in Table 2. Next, both ends were trimmed for each 10 cm, knurling was performed, and the film was wound by 2,000 m. The thickness of the film obtained as above is shown in Table 2. The width of all the films was 2.5 m.

The crystallinity distribution of the stretched film (polyester film before providing the coating layer) obtained as above is shown in Table 2 when measured according to the above-described method.

<Evaluation of Adhesion>

The adhesion of the coating layer was evaluated according to the following method.

The results thereof are shown in Table 2.

(1) A sample film was subjected to a thermal aging at 120° C. and 100% RH for 90 hours.

(2) After the thermal aging, the sample was taken, and on which 10 notches were formed with a cutter knife lengthwise and crosswise at an interval of 3 mm, respectively, thereby forming 100 squares.

(3) The sample was dipped in warm water at 50° C. for 1 hour and was pulled out to a room at 25° C. and 60% RH. The moisture on the surface was removed by a cloth, and an adhesive tape (polyester adhesive tape (No. 31B) manufactured by Nitto Denko Corporation) was bonded thereto and then separated therefrom at once in the 180° direction. Separating was performed within 5 minutes from pulling out of the sample from warm water in view of evaluating the adhesion of the coating layer in the wet state.

(4) The number of squares separated from the coating layer was counted by visual inspection. The results thereof are shown in Table 2 as "Separation Ratio".

<Preparation of Back Sheet>

A white layer was formed on the polyester film provided with the coating layer according to the following method and was dried at 120° C. for 3 hours. Then, a white layer was formed on the opposite surface of the polyester film which was dried at 170° C. for 3 minutes, followed by heating at 160° C. for 3 minutes while transporting the film at a tension of 80 N per the width of 1 m.

—White Layer—

First, components of the following composition were mixed and stirred using a dyno-mill disperser for 1 hour to obtain a pigment dispersion.

| <Composition of Pigment Dispersion> | |
|---|---|
| Titanium dioxide (TIPAQUE R-780-2, manufactured by Ishihara Sangyo Kaisha, Ltd., solid content: 100%) | 39.9 parts |
| Polyvinyl alcohol (PVA-105, manufactured by Kuraray Co., Ltd.; solid content: 10% by mass) | 8.0 parts |

-continued

| <Composition of Pigment Dispersion> | |
|---|---|
| Surfactant (DEMOL EP, manufactured by Kao Corp., solid content; 25% by mass) | 0.5 parts |
| Distilled water | 51.6 parts |

Next, components of the following composition were mixed with using the obtained pigment dispersion to prepare a white layer-forming coating solution.

| <Composition of White Layer-Forming Coating Solution> | |
|---|---|
| The above-described pigment dispersion | 71.4 parts |
| Aqueous polyacrylic resin dispersion (Binder: JURYMER ET410, manufactured by Nihon Junyaku Co., Ltd., solid content: 30% by mass) | 17.1 parts |

| <Composition of White Layer-Forming Coating Solution> | |
|---|---|
| Polyoxyalkylene alkyl ether (NAROACTY CL95, manufactured by Sanyo Chemical Industries, Ltd., solid concentration: 1% by mass) | 2.7 parts |
| Oxazoline compound (crosslinking agent) (EPOCROS WS-700, manufactured by Nippon Shokubai Co., Ltd., solid content: 25% by mass) | 1.8 parts |
| Distilled water | 7.0 parts |

The white layer-forming coating solution obtained as above was coated on the sample film by using a bar coater, followed by drying at 180° C. for one minute. As a result, a white layer having a coating amount of titanium dioxide of 6.5 g/m$^2$.

Preparation conditions and evaluation results of Examples and Comparative Examples are shown in Tables 1 and 2. """ in Tables 1 and 2 represents being the same as above.

TABLE 1

| | Raw Resin | | | | Solid Phase Polymerization | | | | |
|---|---|---|---|---|---|---|---|---|---|
| | Kind | Ti Content Ppm | Kind of ≥ Tri-functional Component | Amount of ≥ Tri-functional Component mol % | Drying Temp. °C. | Drying Temp. Distribution °C. | EG Conc. ppm | EG Conc. Distribution ppm | Water Vapor Conc. ppm |
| Comp. Ex. 1 | Ti | 7 | | | 150 | 8 | 550 | 1100 | 120 |
| Ex. 1 | " | " | | | " | " | 500 | 1000 | " |
| Ex. 2 | " | " | | | " | " | " | 800 | " |
| Ex. 3 | " | " | | | " | " | " | 500 | " |
| Ex. 4 | " | " | | | " | " | " | 250 | " |
| Ex. 5 | " | " | | | " | " | " | 200 | " |
| Comp. Ex. 2 | " | " | | | " | " | " | 180 | " |
| Comp. Ex. A | Ti | 7 | | | 150 | 8 | 500 | 500 | 120 |
| Ex. A | " | " | | | " | " | " | " | " |
| Ex. B | " | " | | | " | " | " | " | " |
| Ex. C | " | " | | | " | " | " | " | " |
| Comp. Ex. B | " | " | | | " | " | " | " | " |
| Ex. 6 | Ti | 14 | | | 170 | 4 | 150 | 250 | 400 |
| Ex. 7 | " | " | | | " | " | " | " | " |
| Ex. 8 | " | " | | | " | " | " | " | " |
| Ex. 9 | " | " | | | " | " | " | " | " |
| Ex. 10 | " | " | | | " | " | " | " | " |
| Ex. 11 | Ti | 4 | | | 160 | 1 | 300 | 500 | 200 |
| Ex. 12 | " | " | | | " | 2 | " | " | " |
| Ex. 13 | " | " | | | " | 5 | " | " | " |
| Ex. 14 | " | " | | | " | 15 | " | " | " |
| Ex. 15 | " | " | | | " | 20 | " | " | " |
| Ex. 16 | Al | 0 | | | 140 | 3 | 200 | 350 | 180 |
| Ex. 17 | Ti | 2 | | | " | " | " | " | " |
| Ex. 18 | " | 3 | | | " | " | " | " | " |
| Ex. 19 | " | 7 | | | " | " | " | " | " |
| Ex. 20 | " | 30 | | | " | " | " | " | " |
| Ex. 21 | " | 50 | | | " | " | " | " | " |
| Ex. 22 | Ti | 3 | | | 175 | 10 | 350 | 400 | 250 |
| Ex. 23 | " | " | | | " | " | " | " | " |
| Ex. 24 | " | " | | | " | " | " | " | " |
| Ex. 25 | " | " | | | " | " | " | " | " |
| Ex. 26 | " | " | | | " | " | " | " | " |
| Ex. 27 | Ti | 18 | | | 155 | 6 | 430 | 600 | 90 |
| Ex. 28 | " | " | | | " | " | " | " | " |
| Ex. 29 | " | " | | | " | " | " | " | " |
| Ex. 30 | " | " | | | " | " | " | " | " |
| Ex. 31 | " | " | | | " | " | " | " | " |
| Ex. 32 | Sb | 0 | | | 160 | 5 | 250 | 400 | 160 |
| Ex. 33 | " | " | | | " | " | " | " | " |
| Ex. 34 | " | " | | | " | " | " | " | " |
| Ex. 35 | " | " | | | " | " | " | " | " |
| Ex. 36 | " | " | | | " | " | " | " | " |

TABLE 1-continued

| | | | | | | | | | |
|---|---|---|---|---|---|---|---|---|---|
| Ex. 37 | Sb | 0 | | | 160 | 0 | 300 | 600 | 200 |
| Ex. 38 | " | " | | | " | " | " | " | " |
| Ex. 39 | " | " | | | " | " | " | " | " |
| Ex. 40 | " | " | | | " | 8 | " | " | " |
| Ex. 41 | Ti | 5 | | | " | " | " | " | " |
| Ex. 42 | " | " | | | " | " | " | " | " |
| Ex. 43 | " | " | | | " | " | " | " | " |
| Comp. Ex. 3 | Sb | 0 | | | Solid Phase Polymerization Was Not Performed | | | | |
| Ex. 44 | Ti | 7 | | | 155 | 5 | 300 | 350 | 180 |
| Comp. Ex. 4 | Sb | 0 | | | Solid Phase Polymerization Was Not Performed | | | | |
| Ex. 45 | Ti | 7 | | | 155 | 5 | 30 | 350 | 180 |
| Ex. 46 | Sb | 0 | | | 150 | 8 | 300 | 600 | 120 |
| Ex. 47 | " | " | | | " | " | " | " | " |
| Ex. 48 | " | " | | | " | " | " | " | " |
| Ex. 49 | " | " | | | " | " | " | " | " |
| Ex. 50 | " | " | | | " | " | " | " | " |
| Ex. 51 | " | " | | | " | " | " | " | " |
| Ex. 52 | " | " | | | " | " | " | " | " |
| Comp. Ex. 5 | " | " | | | " | 0 | 0 | 0 | 0 |
| Ex. 53 | Sb | 0 | | | 150 | 8 | 300 | 600 | 120 |
| Ex. 54 | " | " | | | " | " | " | " | " |
| Ex. 55 | Sb | 0 | TMA | 0.04 | 150 | 8 | 300 | 600 | 120 |
| Ex. 56 | " | " | " | 0.05 | " | " | " | " | " |
| Ex. 57 | " | " | " | 0.025 | " | " | " | " | " |
| Ex. 58 | " | " | " | 0.15 | " | " | " | " | " |
| Ex. 59 | " | " | " | 1 | " | " | " | " | " |
| Ex. 60 | " | " | " | 2.5 | " | " | " | " | " |
| Ex. 61 | " | " | " | 2.6 | " | " | " | " | " |
| Ex. 62 | " | " | BTC | 0.15 | " | " | " | " | " |
| Ex. 63 | " | " | EPC | 0.15 | " | " | " | " | " |
| Ex. 64 | " | " | CHC | 0.15 | " | " | " | " | " |
| Ex. 65 | " | " | THB | 0.15 | " | " | " | " | " |
| Ex. 66 | " | " | PE | 0.15 | " | " | " | " | " |
| Ex. 67 | " | " | TMA | 0.15 | " | " | " | " | " |

| | Solid Phase Polymerization | | | Terminal Sealing Agent | | Extruding |
|---|---|---|---|---|---|---|
| | Water Vapor Conc. Distribution ppm | Solid Phase Polymerization Temperature °C. | Solid Phase Polymerization Time Time | Kind | Addition Amount wt % | Diameter of Screw of Biaxial Extruder mm |
| Comp. Ex. 1 | 220 | 205 | 22 | | | 180 |
| Ex. 1 | " | " | " | | | " |
| Ex. 2 | " | " | " | | | " |
| Ex. 3 | " | " | " | | | " |
| Ex. 4 | " | " | " | | | " |
| Ex. 5 | " | " | " | | | " |
| Comp. Ex. 2 | " | " | " | | | " |
| Comp. Ex. A | 80 | 205 | 22 | | | 180 |
| Ex. A | 100 | " | " | | | " |
| Ex. B | 250 | " | " | | | " |
| Ex. C | 500 | " | " | | | " |
| Comp. Ex. B | 530 | " | " | | | " |
| Ex. 6 | 100 | 180 | 80 | | | 200 |
| Ex. 7 | 150 | " | " | | | " |
| Ex. 8 | 250 | " | " | | | " |
| Ex. 9 | 400 | " | " | | | " |
| Ex. 10 | 500 | " | " | | | " |
| Ex. 11 | 350 | 230 | 10 | | | 160 |
| Ex. 12 | " | " | " | | | " |
| Ex. 13 | " | " | " | | | " |
| Ex. 14 | " | " | " | | | " |
| Ex. 15 | " | " | " | | | " |
| Ex. 16 | 300 | 190 | 60 | | | 260 |
| Ex. 17 | " | " | " | | | " |
| Ex. 18 | " | " | " | | | " |
| Ex. 19 | " | " | " | | | " |
| Ex. 20 | " | " | " | | | " |
| Ex. 21 | " | " | " | | | " |
| Ex. 22 | 180 | 215 | 15 | | | 140 |

TABLE 1-continued

| | | | | | | |
|---|---|---|---|---|---|---|
| Ex. 23 | " | " | " | | | 150 |
| Ex. 24 | " | " | " | | | 180 |
| Ex. 25 | " | " | " | | | 300 |
| Ex. 26 | " | " | " | | | 450 |
| Ex. 27 | 150 | 200 | 30 | | | 200 |
| Ex. 28 | " | " | " | | | " |
| Ex. 29 | " | " | " | | | " |
| Ex. 30 | " | " | " | | | " |
| Ex. 31 | " | " | " | | | " |
| Ex. 32 | 220 | 210 | 30 | | | 220 |
| Ex. 33 | " | " | " | | | " |
| Ex. 34 | " | " | " | | | " |
| Ex. 35 | " | " | " | | | " |
| Ex. 36 | " | " | " | | | " |
| Ex. 37 | 0 | 170 | 9 | | | 120 |
| Ex. 38 | " | 200 | 20 | | | " |
| Ex. 39 | 200 | " | " | | | " |
| Ex. 40 | " | " | " | | | " |
| Ex. 41 | " | " | " | | | " |
| Ex. 42 | " | " | " | | | " |
| Ex. 43 | " | " | " | | | 160 |
| Comp. Ex. 3 | Solid Phase Polymerization Was Not Performed | | | | | Uniaxial 120 |
| Ex. 44 | 250 | 200 | 25 | | | 180 |
| Comp. Ex. 4 | Solid Phase Polymerization Was Not Performed | | | | | Uniaxial 120 |
| Ex. 45 | 250 | 200 | 25 | | | 180 |
| Ex. 46 | 220 | 230 | 20 | Cl | 0 | 180 |
| Ex. 47 | " | " | " | " | 0.1 | " |
| Ex. 48 | " | " | " | " | 0.3 | " |
| Ex. 49 | " | " | " | " | 1 | " |
| Ex. 50 | " | " | " | " | 4 | " |
| Ex. 51 | " | " | " | " | 5 | " |
| Ex. 52 | " | " | " | " | 6 | " |
| Comp. Ex. 5 | 0 | " | " | " | 1 | Uniaxial 180 |
| Ex. 53 | 220 | 230 | 20 | EP | 1 | 180 |
| Ex. 54 | " | " | " | OX | 1 | " |
| Ex. 55 | 220 | 220 | 9 | | | 220 |
| Ex. 56 | " | " | " | | | " |
| Ex. 57 | " | " | " | | | " |
| Ex. 58 | " | " | " | | | " |
| Ex. 59 | " | " | " | | | " |
| Ex. 60 | " | " | " | | | " |
| Ex. 61 | " | " | " | | | " |
| Ex. 62 | " | " | " | | | " |
| Ex. 63 | " | " | " | | | " |
| Ex. 64 | " | " | " | | | " |
| Ex. 65 | " | " | " | | | " |
| Ex. 66 | " | " | " | | | " |
| Ex. 67 | " | " | " | Cl | 1 | " |

TABLE 2

| | | Coating → Stretching | | | | Properties of Polyester Resin | | | |
|---|---|---|---|---|---|---|---|---|---|
| | Order | Water Vapor Concentration g/Nm$^3$ | Water Vapor Concentration Distribution % | Coating Solution | Thickness of Coating Layer μm | Heat Setting Temperature °C | AV eq/l | IV | Tm' °C | Temperature Distribution of Tm' °C |
| Comp. Ex. 1 | #1 | 8 | 8 | A-1 | 0.5 | 200 | 2 | 0.68 | 250 | 4.5 |
| Ex. 1 | " | " | " | " | " | 210 | 3 | 0.7 | " | " |
| Ex. 2 | " | " | " | " | " | 215 | 5 | 0.13 | " | " |
| Ex. 3 | " | " | " | " | " | 220 | 15 | 0.8 | " | " |
| Ex. 4 | " | " | " | " | " | 225 | 18 | 0.87 | " | " |
| Ex. 5 | " | " | " | " | " | 230 | 20 | 0.9 | " | " |
| Comp. Ex. 2 | " | " | " | " | " | 240 | 21 | 0.92 | " | " |
| Comp. Ex. A | #1 | 8 | 8 | A-1 | 0.5 | 220 | 15 | 0.8 | 250 | 0 |
| Ex. A | " | " | " | " | " | " | " | " | " | 1 |
| Ex. B | " | " | " | " | " | " | " | " | " | 3 |
| Ex. C | " | " | " | " | " | " | " | " | " | 10 |
| Comp. Ex. B | " | " | " | " | " | " | " | " | " | 11 |
| Ex. 6 | #2 | 10 | 5 | U-2 | 0.2 | 200 | 11 | 0.75 | 245 | 1 |
| Ex. 7 | " | " | " | " | " | " | " | " | " | 1.5 |

TABLE 2-continued

| | | | | | | | | | | |
|---|---|---|---|---|---|---|---|---|---|---|
| Ex. 8 | " | " | " | " | " | " | " | " | " | 3 |
| Ex. 9 | " | " | " | " | " | " | " | " | " | 8 |
| Ex. 10 | " | " | " | " | " | " | " | " | " | 10 |
| Ex. 11 | #3 | 1 | 22 | E-5 | 0.7 | 230 | 16 | 0.85 | 255 | 1.2 |
| Ex. 12 | " | " | " | " | " | " | " | " | " | 1.8 |
| Ex. 13 | " | " | " | " | " | " | " | " | " | 4 |
| Ex. 14 | " | " | " | " | " | " | " | " | " | 7 |
| Ex. 15 | " | " | " | " | " | " | " | " | " | 9 |
| Ex. 16 | #4 | 5 | 15 | E-2 | 0.3 | 212 | 13 | 0.78 | 247 | 1.3 |
| Ex. 17 | " | " | " | " | " | " | " | " | " | 1.6 |
| Ex. 18 | " | " | " | " | " | " | " | " | " | 1.7 |
| Ex. 19 | " | " | " | " | " | " | " | " | " | 4 |
| Ex. 20 | " | " | " | " | " | " | " | " | " | 7.5 |
| Ex. 21 | " | " | " | " | " | " | " | " | " | 9.5 |
| Ex. 22 | #5 | 0.3 | 25 | V-1 | 0.6 | 227 | 15 | 0.83 | 252 | 2.5 |
| Ex, 23 | " | " | " | " | " | " | " | " | " | " |
| Ex. 24 | " | " | " | " | " | " | " | " | " | " |
| Ex. 25 | " | " | " | " | " | " | " | " | " | " |
| Ex. 26 | " | " | " | " | " | " | " | " | " | " |
| Ex. 27 | #6 | 40 | 5 | U-1 | 0.8 | 218 | 14 | 0.8 | 248 | 5.5 |
| Ex. 28 | " | " | " | " | " | " | " | " | " | " |
| Ex. 29 | " | " | 12 | " | " | " | " | " | " | " |
| Ex. 30 | " | " | 25 | " | " | " | " | " | " | " |
| Ex. 31 | " | " | 30 | " | " | " | " | " | " | " |
| Ex. 32 | #2 | 0.6 | 10 | E-1 | 0.05 | 219 | 17 | 0.82 | 251 | 2 |
| Ex. 33 | " | " | " | " | 0.1 | " | " | " | " | " |
| Ex. 34 | " | " | " | " | 0.5 | " | " | " | " | " |
| Ex. 35 | " | " | " | " | 1 | " | " | " | " | " |
| Ex. 36 | " | " | " | " | 1.5 | " | " | " | " | " |
| Ex. 37 | #1 | 0.6 | 0 | E-6 | 0.1 | 150 | 15 | 0.63 | 252 | 1.2 |
| Ex. 38 | " | " | " | " | " | " | " | 0.8 | " | 1.7 |
| Ex. 39 | " | " | " | " | " | " | " | " | " | 2 |
| Ex. 40 | " | " | " | " | " | " | " | " | " | 3 |
| Ex. 41 | " | " | " | " | " | " | " | " | " | 4 |
| Ex. 42 | " | " | 15 | " | " | " | " | " | " | 4 |
| Ex. 43 | " | " | " | " | " | " | " | " | " | 4 |
| Comp. Ex. 3 | #1 | 3 | 0 | V-1 | 0.08 | 224 | 42 | 0.62 | 253 | 0 |
| Ex. 44 | " | 3 | 15 | " | 0.08 | 190 | 15 | 0.79 | 252 | 5 |
| Comp. Ex. 4 | #1 | 5 | 0 | U-4 | 1.4 | 227 | 36 | 0.66 | 253 | 0 |
| Ex. 45 | " | " | 12 | " | 1.4 | 230 | 14 | 0.78 | 254 | 3 |
| Ex. 46 | #1 | 8 | 8 | A-1 | 0.5 | " | 5 | 0.79 | 252 | 3 |
| Ex. 47 | " | " | " | " | " | " | " | " | " | 3 |
| Ex. 48 | " | " | " | " | " | " | " | " | " | 3 |
| Ex. 49 | " | " | " | " | " | " | " | " | " | 3 |
| Ex. 50 | " | " | " | " | " | " | " | " | " | 3 |
| Ex. 51 | " | " | " | " | " | " | " | " | " | 3 |
| Ex. 52 | " | " | " | " | " | " | " | " | " | 3 |
| Comp. Ex. 5 | " | 0 | 0 | " | " | " | " | " | " | 0 |
| Ex. 53 | #1 | 8 | 8 | A-1 | 0.5 | " | 5 | 0.79 | 252 | 3 |
| Ex. 54 | " | " | " | " | " | " | " | " | " | 3 |
| Ex. 55 | #1 | 3 | 9 | A-1 | 0.7 | 235 | 12 | 0.9 | 253 | 3 |
| Ex. 56 | " | " | " | " | " | " | " | " | " | 3 |
| Ex. 57 | " | " | " | " | " | " | " | " | " | 3 |
| Ex. 58 | " | " | " | " | " | " | " | " | " | 3 |
| Ex. 59 | " | " | " | " | " | " | " | " | " | 3 |
| Ex. 60 | " | " | " | " | " | " | " | " | " | 3 |
| Ex. 61 | " | " | " | " | " | " | " | " | " | 3 |
| Ex. 62 | " | " | " | " | " | " | " | " | " | 3 |
| Ex. 63 | " | " | " | " | " | " | " | " | " | 3 |
| Ex. 64 | " | " | " | " | " | " | " | " | " | 3 |
| Ex. 65 | " | " | " | " | " | " | " | " | " | 3 |
| Ex. 66 | " | " | " | " | " | " | " | " | " | 3 |
| Ex. 67 | " | " | " | " | " | " | " | " | " | 3 |

| | Properties of Film | | | |
|---|---|---|---|---|
| | Average Crystalline Band Strength | Crystallinity Distribution | Peeling Ratio of Coating Layer % | Film Thickness μm |
| Comp. Ex. 1 | 2.6 | 0 | 50 | 50 |
| Ex. 1 | 2.5 | 5 | 25 | " |
| Ex. 2 | 2.4 | 7 | 12 | " |
| Ex. 3 | 1.8 | 10 | 0 | " |

TABLE 2-continued

| | | | | |
|---|---|---|---|---|
| Ex. 4 | 1.3 | 30 | 12 | " |
| Ex. 5 | 1.1 | 50 | 24 | " |
| Comp. Ex. 2 | 0.9 | 51 | 55 | " |
| Comp. Ex. A | 1.8 | 0 | 53 | 50 |
| Ex. A | " | 5 | 26 | " |
| Ex. B | " | 12 | 0 | " |
| Ex. C | " | 50 | 26 | " |
| Comp. Ex. B | " | 52 | 52 | " |
| Ex. 6 | 2.2 | 7 | 12 | 35 |
| Ex. 7 | " | 7.5 | 5 | " |
| Ex. 8 | " | 9 | 0 | " |
| Ex. 9 | " | 22 | 6 | " |
| Ex. 10 | " | 28 | 14 | " |
| Ex. 11 | 1.8 | 7.2 | 13 | 125 |
| Ex. 12 | " | 7.8 | 5 | " |
| Ex. 13 | " | 12 | 0 | " |
| Ex. 14 | " | 22 | 6 | " |
| Ex. 15 | " | 27 | 14 | " |
| Ex. 16 | 2.1 | 5.5 | 19 | 188 |
| Ex. 17 | " | 7.2 | 16 | " |
| Ex. 18 | " | 7.8 | 5 | " |
| Ex. 19 | " | 11 | 0 | " |
| Ex. 20 | " | 21 | 4 | " |
| Ex. 21 | " | 26 | 12 | " |
| Ex. 22 | 1.9 | 6.7 | 13 | 210 |
| Ex. 23 | " | 7.2 | 6 | " |
| Ex. 24 | " | 8 | 0 | " |
| Ex. 25 | " | 25 | 5 | " |
| Ex. 26 | " | 30 | 12 | " |
| Ex. 27 | 2 | 7.1 | 15 | 250 |
| Ex. 28 | " | 7.9 | 5 | " |
| Ex. 29 | " | 12 | 0 | " |
| Ex. 30 | " | 22 | 6 | " |
| Ex. 31 | " | 28 | 14 | " |
| Ex. 32 | 1.8 | 14 | 12 | 300 |
| Ex. 33 | " | " | 5 | " |
| Ex. 34 | " | " | 3 | " |
| Ex. 35 | " | " | 6 | " |
| Ex. 36 | " | " | 14 | " |
| Ex. 37 | 1.1 | 5 | 29 | 350 |
| Ex. 38 | 1.2 | 6 | 18 | " |
| Ex. 39 | 1.2 | 7 | 12 | " |
| Ex. 40 | 1.2 | 8 | 6 | " |
| Ex. 41 | 1.2 | 8 | 4 | " |
| Ex. 42 | 1.6 | 10 | 2 | " |
| Ex. 43 | 1.8 | 12 | 0 | " |
| Comp. Ex. 3 | 0.9 | 0 | 65 | 50 |
| Ex. 44 | 1.9 | 12 | 6 | 50 |
| Comp. Ex. 4 | 0.8 | 0 | 66 | 50 |
| Ex. 45 | 1.6 | 9 | 5 | 50 |
| Ex. 46 | 1.3 | 8 | 7 | 125 |
| Ex. 47 | 1.3 | 8 | 5 | " |
| Ex. 48 | 1.3 | 8 | 3 | " |
| Ex. 49 | 1.3 | 8 | 1 | " |
| Ex. 50 | 1.3 | 8 | 3 | " |
| Ex. 51 | 1.2 | 7.5 | 5 | " |
| Ex. 52 | 1.1 | 6 | 8 | " |
| Comp. Ex. 5 | 1 | 0 | 52 | " |
| Ex. 53 | 2.6 | 8 | 3 | 125 |
| Ex. 54 | 2.5 | 8 | 3 | " |
| Ex. 55 | 1.3 | 8 | 6 | 100 |
| Ex. 56 | 1.3 | 8 | 5 | " |
| Ex. 57 | 1.3 | 8 | 3 | " |
| Ex. 58 | 1.3 | 8 | 1 | " |
| Ex. 59 | 1.3 | 8 | 3 | " |
| Ex. 60 | 1.2 | 7 | 6 | " |
| Ex. 61 | 1.1 | 5.5 | 9 | " |
| Ex. 62 | 1.3 | 7.5 | 4 | " |
| Ex. 63 | 1.3 | 6.5 | 5 | " |
| Ex. 64 | 1.3 | 6 | 6 | " |
| Ex. 65 | 1.3 | 7 | 5 | " |
| Ex. 66 | 1.3 | 6.5 | 6 | " |
| Ex. 67 | 1.2 | 10 | 0 | " |

It was clearly seen from Table 2 that the polyester films according to Examples 1 to 67 have a lower separation ratio, that is, higher adhesion than those of Comparative Examples.

The disclosure of Japanese Patent Application No. 2011-051779 filed on Mar. 9, 2011, is incorporated by reference herein.

All publications, patent applications, and technical standards described in this specification are herein incorporated by reference to the same extent as if each individual publication, patent application, or technical standard was specifically and individually indicated to be incorporated by reference.

What is claimed is:

1. A method of manufacturing a polyester film, comprising:
   preparing a polyester film substrate having an amount of a terminal carboxylic acid group (AV) of from 3 eq/ton to 20 eq/ton, by using a polyester resin having a temperature distribution of a pre-melting peak (Tm') of from 1° C. to 10° C.;
   providing a coating layer on at least one surface of the polyester film substrate; and
   stretching the polyester film substrate provided with the coating layer at least once.

2. The method according to claim 1, wherein the preparing of a polyester film substrate comprises:
   obtaining the polyester resin by subjecting a polyester raw resin to a solid phase polymerization, the concentration of ethylene glycol gas at a time of the start of the solid phase polymerization being higher than the concentration of ethylene glycol gas at a time of the completion of the solid phase polymerization by from 200 ppm to 1000 ppm; and
   melt-extruding the polyester resin.

3. The method according to claim 2, further comprising setting the concentration of water vapor at the time of the start of the solid phase polymerization to be higher than the concentration of water vapor at the time of the completion of the solid phase polymerization by 100 ppm to 500 ppm.

4. The method according to claim 2, further comprising drying the polyester raw resin at 130° C. to 180° C. in a dry bath having a temperature distribution of from 1° C. to 20° C. before the solid phase polymerization.

5. The method according to claim 1, wherein the preparing of a polyester film comprises melt-extruding the polyester resin using a biaxial extruder provided with a screw having a diameter of 140 mm or larger.

6. The method according to claim 1, wherein the stretching is performed in the presence of water vapor having a concentration distribution of from 5% to 30%.

7. The method according to claim 1, wherein an average temperature of the pre-melting peak (Tm') is from 230° C. to 263° C.

8. A polyester film, comprising:
   a polyester film substrate; and
   a coating layer that is provided on at least one surface of the polyester film substrate,
   wherein a crystallinity distribution of a surface of the polyester film substrate on the side on which the coating film is provided is from 5% to 50%, and
   wherein the crystallinity distribution is determined according to the following formula based on the maximum value, the minimum value, and the average value, of the crystallinity measured by an ATR-IR method at six measuring points of six samples cut out from a 30 cm×30 cm-square film, Crystallinity Distribution (%)=[(Maximum Value of Crystallinity)−(Minimum Value of Crystallinity)]/[Average Value of Crystallinity]×100.

9. The polyester film according to claim 8, wherein the coating layer comprises an acrylic resin, an urethane resin, a polyester resin, or a polyolefin resin.

10. The polyester film according to claim 8, wherein the thickness of the coating layer is from 0.05 μm to 1.5 μm.

11. The polyester film according to claim 8, wherein a content of a component in which a total number of a carboxylic acid group and a hydroxyl group is 3 or more in the polyester film substrate is from 0.005 mol % to 2.5 mol %.

12. The polyester film according to claim 8, wherein the polyester film substrate comprises at least one terminal blocking agent selected from the group consisting of an isocyanate compound, a carbodiimide compound, and an epoxy compound, at a content of from 0.1% by mass to 5% by mass.

13. The polyester film according to claim 8, wherein the polyester film substrate comprises a Ti element at a content of from 2 ppm to 50 ppm.

14. The polyester film according to claim 8, wherein an intrinsic viscosity (IV) of the polyester film substrate is from 0.7 to 0.9.

15. A back sheet for a solar cell, comprising the polyester film according to claim 8.

* * * * *